(12) United States Patent
Sui et al.

(10) Patent No.: US 11,848,657 B2
(45) Date of Patent: Dec. 19, 2023

(54) FILM BULK ACOUSTIC RESONATOR AND FABRICATION METHOD THEREOF

(71) Applicant: Ningbo Semiconductor International Corporation, Ningbo (CN)

(72) Inventors: Huan Sui, Ningbo (CN); Fei Qi, Ningbo (CN); Guohuang Yang, Ningbo (CN)

(73) Assignee: NINGBO SEMICONDUCTOR INTERNATIONAL CORPORATION, Ningbo (CN)

( * ) Notice: Subject to any disclaimer, the term of this patent is extended or adjusted under 35 U.S.C. 154(b) by 353 days.

(21) Appl. No.: 17/195,987

(22) Filed: Mar. 9, 2021

(65) Prior Publication Data

US 2021/0218384 A1 Jul. 15, 2021

Related U.S. Application Data

(63) Continuation of application No. PCT/CN2019/107174, filed on Sep. 23, 2019.

(30) Foreign Application Priority Data

Jul. 19, 2019 (CN) .......................... 201910657445.X

(51) Int. Cl.
*H03H 9/17* (2006.01)
*H03H 9/02* (2006.01)
*H03H 3/02* (2006.01)

(52) U.S. Cl.
CPC .......... *H03H 9/02125* (2013.01); *H03H 3/02* (2013.01); *H03H 9/173* (2013.01); *H03H 2003/021* (2013.01)

(58) Field of Classification Search
CPC .............. H03H 9/02125; H03H 9/173; H03H 2003/021
See application file for complete search history.

(56) References Cited

U.S. PATENT DOCUMENTS

2006/0270090 A1* 11/2006 Bradley ............ H03H 9/02149
438/48
2010/0327697 A1* 12/2010 Choy ...................... H03H 9/132
333/187

(Continued)

FOREIGN PATENT DOCUMENTS

| CN | 101069344 A | 11/2007 |
|---|---|---|
| CN | 107196618 A | 9/2017 |

(Continued)

*Primary Examiner* — Bryan P Gordon
(74) *Attorney, Agent, or Firm* — ANOVA LAW GROUP PLLC

(57) ABSTRACT

The present disclosure provides a film bulk acoustic resonator and its fabrication method. The film bulk acoustic resonator includes a first substrate, a first support layer containing a first cavity, a piezoelectric stacked layer, and a first separation structure and/or a second separation structure. The piezoelectric stacked layer includes an effective working region and a parasitic working region; and in the parasitic working region, a first electrode and a second electrode have a corresponding region along a thickness direction. The first separation structure separates the first electrode, and the first electrode of a portion of the parasitic working region is insulated from the first electrode of the effective working region; and the second separation structure separates the second electrode, and the second electrode of a portion of the parasitic working region is insulated from the second electrode of the effective working region.

12 Claims, 17 Drawing Sheets

(56) References Cited

U.S. PATENT DOCUMENTS

| | | | | |
|---|---|---|---|---|
| 2013/0147577 A1* | 6/2013 | Nishihara | ............... | H03H 9/54 333/133 |
| 2015/0207489 A1* | 7/2015 | Bi | ........................ | H03H 9/173 310/324 |
| 2016/0352308 A1* | 12/2016 | Ivira | ...................... | H03H 9/173 |
| 2017/0338799 A1* | 11/2017 | Ruby | .................... | H03H 9/171 |
| 2018/0294794 A1 | 10/2018 | Liu et al. | | |

FOREIGN PATENT DOCUMENTS

| | | | |
|---|---|---|---|
| CN | 109309483 | A | 2/2019 |
| JP | 200898831 | A | 4/2008 |
| JP | 200938518 | A | 2/2009 |
| JP | 2009200714 | A | 9/2009 |
| JP | 2009212620 | A | 9/2009 |
| JP | 201045437 | A | 2/2010 |
| JP | 2010118730 | A | 5/2010 |
| JP | 2011160232 | A | 8/2011 |
| JP | 2013175985 | A | 9/2013 |
| JP | 2018182463 | A | 11/2018 |
| JP | 2018536157 | A | 12/2018 |
| WO | 2006062082 | A1 | 6/2006 |
| WO | 2009028027 | A1 | 3/2009 |
| WO | 20130175985 | A1 | 11/2013 |

\* cited by examiner

```
┌─────────────────────────────────────────────────────────────────┐
│ Providing a third substrate and forming a piezoelectric stacked  │──S01
│ layer structure on the third substrate, where the piezoelectric  │
│ stacked layer structure includes a second electrode layer, a     │
│ piezoelectric material layer, and a first electrode layer which  │
│ are sequentially formed on the third substrate                   │
└─────────────────────────────────────────────────────────────────┘
                              │
                              ▼
┌─────────────────────────────────────────────────────────────────┐
│ Forming a first support layer on the first electrode layer, and  │──S02
│ forming a first cavity, passing through the first support layer, │
│ in the first support layer                                       │
└─────────────────────────────────────────────────────────────────┘
                              │
                              ▼
┌─────────────────────────────────────────────────────────────────┐
│ After forming the first cavity, etching the first electrode      │──S03
│ layer to form a first opening passing through the first          │
│ electrode layer along a thickness direction                      │
└─────────────────────────────────────────────────────────────────┘
                              │
                              ▼
┌─────────────────────────────────────────────────────────────────┐
│ Providing a first substrate and bonding the first substrate with │──S04
│ the first support layer                                          │
└─────────────────────────────────────────────────────────────────┘
                              │
                              ▼
┌─────────────────────────────────────────────────────────────────┐
│ Removing the third substrate                                     │──S05
└─────────────────────────────────────────────────────────────────┘
                              │
                              ▼
┌─────────────────────────────────────────────────────────────────┐
│ Patterning the piezoelectric stacked layer structure to form a   │
│ first electrode, a piezoelectric layer and a second electrode,   │
│ and to divide the piezoelectric stacked layer structure into an  │
│ effective working region and a parasitic working region, where   │
│ in the parasitic working region, the first electrode and the     │
│ second electrode have a corresponding region along the thickness │
│ direction; and in at least a portion of the corresponding        │──S06
│ region, the first opening insulates at least a portion of the    │
│ first electrode of the parasitic working region from the first   │
│ electrode of the effective working region; and/or etching the    │
│ second electrode to form a second opening, where in at least a   │
│ portion of the corresponding region, the second opening insulates│
│ at least a portion of the second electrode of the parasitic      │
│ working region from the second electrode of the effective        │
│ working region                                                   │
└─────────────────────────────────────────────────────────────────┘
```

FIG. 1

FILM BULK ACOUSTIC RESONATOR AND FABRICATION METHOD THEREOF

CROSS-REFERENCE TO RELATED APPLICATIONS

This application is a continuation application of PCT Patent Application No. PCT/CN2019/107174, filed on Sep. 23, 2019, which claims priority to Chinese patent application No. 201910657445.X, filed on Jul. 19, 2019, the entirety of all of which is incorporated herein by their reference.

FIELD OF THE DISCLOSURE

The present disclosure generally relates to the field of semiconductor device manufacturing, and more particularly, relates to a film bulk acoustic resonator and its fabrication method.

BACKGROUND

Since the analog radio frequency (RF) communication technology is developed in the early 1990, RF front-end modules have gradually become the core components of communication devices. Among all RF front-end modules, the filters have become the components with the most promising growth momentum and development potential. With the rapid development of wireless communication technology, the 5G communication protocol has been developed more maturely, and the market has also put forward more stringent standards for the performance of RF filters in all aspects. The performance of the filters is determined by the resonator units which are used to form the filters. Among the existing filters, the film bulk acoustic resonator (FBAR) has become one of the most suitable filters for 5G applications because of its characteristics, including small size, low insertion loss, large out-of-band suppression, high quality factor, high operating frequency, large power capacity, desirable resistance to electrostatic shock, and the like.

The film bulk acoustic resonator includes two film electrodes, and a piezoelectric film layer is arranged between the two film electrodes. The FBAR working principle is described as the following. The piezoelectric film layer is used to generate vibration under an alternating electric field; the vibration excites the bulk acoustic wave propagating along the thickness direction of the piezoelectric film layer; such acoustic wave may be reflected back from the interface between the air and each of the two film electrodes, and then be reflected back and forth inside the film layer to form an oscillation. When the acoustic wave propagates in the piezoelectric film layer having exactly an odd multiple of the half wavelength, a standing wave oscillation is formed.

However, the quality (Q) factor of the currently fabricated cavity-type film bulk acoustic resonator cannot be further improved to meet the requirements of high-performance RF systems.

BRIEF SUMMARY OF THE DISCLOSURE

The present disclosure provides a film bulk acoustic resonator and its fabrication method, which may increase the quality factor of the film bulk acoustic resonator to further improve the device performance.

One aspect of the present disclosure provides the film bulk acoustic resonator, including:

a first substrate and a first support layer disposed on the first substrate, where the first support layer contains a first cavity;

a piezoelectric stacked layer covering a top opening of the first cavity, where the piezoelectric stacked layer includes a first electrode, a piezoelectric layer, and a second electrode which are sequentially disposed on the first support layer; and the piezoelectric stacked layer includes an effective working region and a parasitic working region, where in the parasitic working region, the first electrode and the second electrode have a corresponding region along a thickness direction; and a first separation structure and/or a second separation structure, where:

the first separation structure separates the first electrode, and in at least a portion of the corresponding region, the first electrode of a portion of the parasitic working region is insulated from the first electrode of the effective working region; and the second separation structure separates the second electrode, and in at least a portion of the corresponding region, the second electrode of a portion of the parasitic working region is insulated from the second electrode of the effective working region.

Another aspect of the present disclosure provides the method for fabricating the film bulk acoustic resonator, including:

providing a third substrate and forming a piezoelectric stacked layer structure on the third substrate, where the piezoelectric stacked layer structure includes a second electrode layer, a piezoelectric material layer, and a first electrode layer which are sequentially formed on the third substrate;

forming a first support layer on the first electrode layer, and forming a first cavity, passing through the first support layer, in the first support layer;

after forming the first cavity, etching the first electrode layer to form a first opening passing through the first electrode layer along a thickness direction;

providing a first substrate and bonding the first substrate with the first support layer;

removing the third substrate;

patterning the piezoelectric stacked layer structure to form a first electrode, a piezoelectric layer and a second electrode, and to divide the piezoelectric stacked layer structure into an effective working region and a parasitic working region, where in the parasitic working region, the first electrode and the second electrode have a corresponding region along the thickness direction; and in at least a portion of the corresponding region, the first opening insulates at least a portion of the first electrode of the parasitic working region from the first electrode of the effective working region;

and/or etching the second electrode to form a second opening, where in at least a portion of the corresponding region, the second opening insulates at least a portion of the second electrode of the parasitic working region from the second electrode of the effective working region.

Another aspect of the present disclosure provides the method for fabricating the film bulk acoustic resonator, including:

providing a third substrate and forming a piezoelectric stacked layer structure on the third substrate, where the piezoelectric stacked layer structure includes a second electrode layer, a piezoelectric material layer, and a first electrode layer which are sequentially formed on the third substrate;

forming a first support layer on the first electrode layer, and forming a first cavity, passing through the first support layer, in the first support layer;

providing a first substrate and bonding the first substrate with the first support layer;

removing the third substrate;

patterning the piezoelectric stacked layer structure to form a first electrode, a piezoelectric layer and a second electrode, and to divide the piezoelectric stacked layer structure into an effective working region and a parasitic working region, where in the parasitic working region, the first electrode and the second electrode have a corresponding region along the thickness direction; and etching the second electrode, the piezoelectric layer and the first electrode to form an opening, where in at least a portion of the corresponding region, the opening insulates the first electrode of the parasitic working region from the first electrode of the effective working region and insulates the second electrode of the parasitic working region from the second electrode of the effective working region.

Other aspects of the present disclosure can be understood by those skilled in the art in light of the description, the claims, and the drawings of the present disclosure.

BRIEF DESCRIPTION OF THE DRAWINGS

In order to clearly explain the technical solutions in the embodiments of the present disclosure or the existing technology, the drawings that need to be used in the description of the embodiments or the existing technology are illustrated hereinafter. Obviously, the drawings in the following description are merely some embodiments of the present disclosure. For those skilled in the art, other drawings can be obtained based on such drawings without creative work.

FIG. 1 illustrates a flowchart of a fabrication method of a film bulk acoustic resonator according to various embodiments of the present disclosure;

DETAILED DESCRIPTION

Figure 2A:
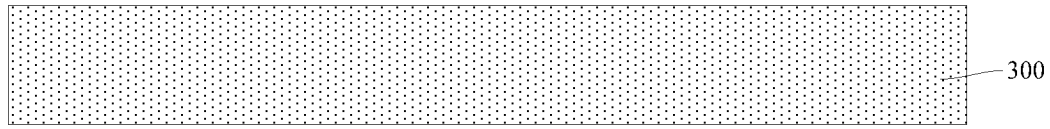
FIGS. 2A-2P illustrate structural schematics corresponding to certain stages of a fabrication method of a film bulk acoustic resonator according to various embodiments of the present disclosure.

A film bulk acoustic resonator and a fabrication method of the film bulk acoustic resonator in the present disclosure may be further described in detail with reference to the accompanying drawings and specific embodiments hereinafter. The advantages and features of the present disclosure may be more apparent according to the following description and the accompanying drawings. However, it should be noted that the concept of the technical solution of the present disclosure may be implemented in various different forms and may not be limited to specific embodiments set forth herein. The accompanying drawings may be all in simplified forms and non-precise scales and may be merely for convenience and clarity of the purpose of the embodiments of the present disclosure.

The terms "first", "second" and the like in the specification and the claims may be used to distinguish similar elements and may be not necessarily used to describe a particular order or chronological order. It should be understood that the used terms may be substituted, as appropriate. For example, the embodiments described herein of the present disclosure may be enabled to operate in other sequences than sequences described or illustrated herein. Similarly, if the method described herein comprise a series of steps, the order of the steps presented herein may not be necessarily the only order in which the steps may be performed, and some of the steps may be omitted and/or other steps, which are not described herein, may be added to the method. If components in one of the drawings are same as components in other drawings, although the components may be easily recognized in all drawings, in order to make the description of the drawings clearer, labels of all the same components may not be marked in each figure in the present specification.

Embodiment 1

One embodiment of the present disclosure provides a film bulk acoustic resonator. Referring to FIGS. 2J-2L, FIG. 2K illustrates a top view of the film bulk acoustic resonator according to the embodiments of the present disclosure; FIG. 2J illustrates a cross-sectional structural schematic along a BB' axis in FIG. 2K; and FIG. 2L illustrates a cross-sectional structural schematic along a CC' axis in FIG. 2K. The film bulk acoustic resonator may include:

a first substrate 100 and a first support layer 101 disposed on the first substrate, where a first cavity 110a is disposed in the first support layer 101; a piezoelectric stacked layer 120 covering a top opening of the first cavity 110a, where the piezoelectric stacked layer 120 may include a first electrode 103, a piezoelectric layer 104, and a second electrode 105 which are sequentially disposed on the first support layer 101, and include an effective working region 001 and a parasitic working region 002 surrounding the effective working region, where in the parasitic working region 002, the first electrode 103 and the second electrode 105 may have a corresponding region (108 shown in FIG. 2J) along the thickness direction; a first separation structure, separating the first electrode 103, such that in at least a portion of the corresponding region, the first electrode 103 of a portion of the parasitic working region 002 may be insulated from the first electrode 103 of the effective working region 001; and/or a second separation structure, separating the second electrode 105, such that in at least a portion of the corresponding region, the second electrode 105 of a portion of the parasitic working region 002 may be insulated from the second electrode 105 of the effective working region 001.

The first electrode 103 may have a first dividing structure. The first dividing structure may include a first trench 120a which passes through the first electrode 103 and the piezoelectric layer 104 along the thickness direction. The second electrode 105 may have a second dividing structure. The second dividing structure may include a second trench 120b which passes through the second electrode 105 and the piezoelectric layer 104 along the thickness direction. The first dividing structure and the second dividing structure may complementarily enclose a ring to define the effective working region 001 and the parasitic working region 002. A region inside the ring is the effective working region 001, and a region outside the ring is the parasitic working region 002. The ring shape may be a polygonal ring, and any two sides of the polygonal ring may not be in parallel with each other. Above the first cavity 110a, the first electrode 103 of the parasitic working region 002 may be a surface electrode surrounding the effective working region 001, and the second electrode 105 of the parasitic working region 002 may be a surface electrode surrounding the effective working region 002.

The sidewalls of the first trench 120a and the second trench 120b may be inclined or vertical. In one embodiment, the sidewall of the first trench 120a may form an obtuse angle with the plane where the second electrode 105 is located, and the sidewall of the second trench 120b may form an obtuse angle with the plane where the first electrode 103 is located. That is, the longitudinal cross-sections (cross-sections along the thickness direction) of the first trench 120a and the second trench 120b are inverted trapezoids. The projections of the first trench 120a and the second trench 120b on the plane of the piezoelectric layer 104 may be half-ring or half-ring-like polygons. In one embodiment, the first trench 120a may only pass through the first electrode 103, and the second trench 120b may also pass through the second electrode 105. It should be noted that the first dividing structure and the second dividing structure may be composed of a plurality of trenches, and the plurality of trenches may enclose the shapes of the first trench and the second trench, thereby dividing the piezoelectric stacked layer into the effective working region 001 and the parasitic working region 002.

In one embodiment, the first separation structure may include a first opening 140a formed in the first electrode 103; and the first opening 140a may divide the first electrode 103 into a plurality of first electrode portions separated from each other. In one embodiment, the first separation structure may also include the first opening 140a formed in the first electrode 103 and an insulation material filled in the first opening 140a. In one embodiment, the second separation structure may include a second opening 140b formed in the second electrode 105; and the second opening 140b may divide the second electrode 105 into a plurality of second electrode portions separated from each other. In one embodiment, the second separation structure may also include the second opening 140b formed in the second electrode 105 and an insulation material filled in the second opening 140b.

In one embodiment, the first separation structure may be located on the side of the first dividing structure or at the junction of the first dividing structure and the second dividing structure; and the second separation structure may be located on the side of the second dividing structure or at the junction of the first dividing structure and the second dividing structure. Exemplarily, in one embodiment, the first separation structure and the second separation structure may be respectively located at the junctions of the first dividing structure and the second dividing structure. That is, referring to FIG. 2F, the first opening 140a may be located at the junction of the projections of the first trench 120a and the second trench 120b on the plane where the piezoelectric layer 104 is located and may extend till dividing the first electrode 103. Referring to FIG. 2K, the second opening 140b may be located at the junction of the projections of the first trench 120a and the second trench 120b on the plane where the piezoelectric layer 104 is located and may extend till dividing the second electrode 105.

Figure 2B:
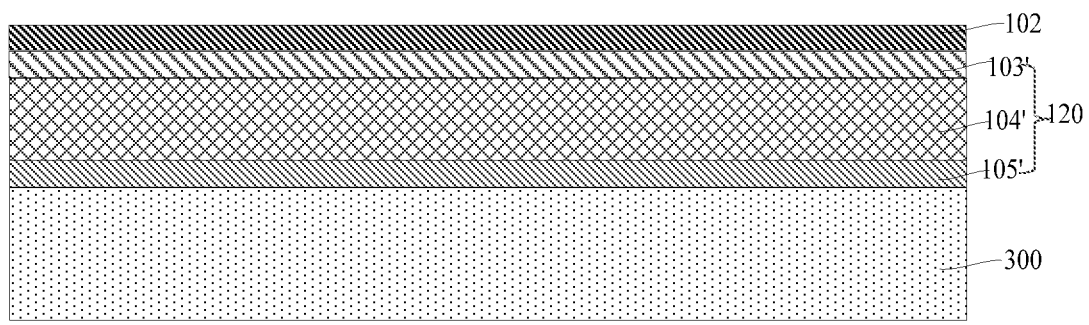
Figure 2C:
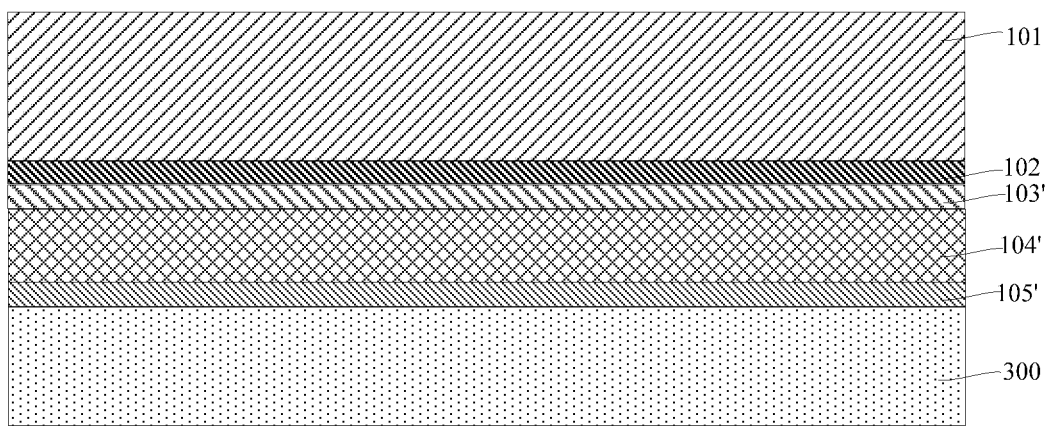
Figure 2D:
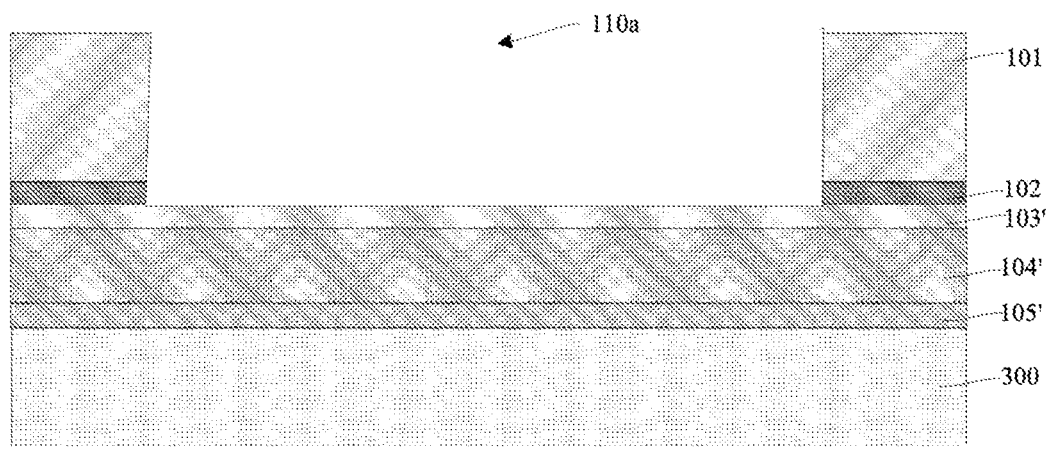
Figure 2E:
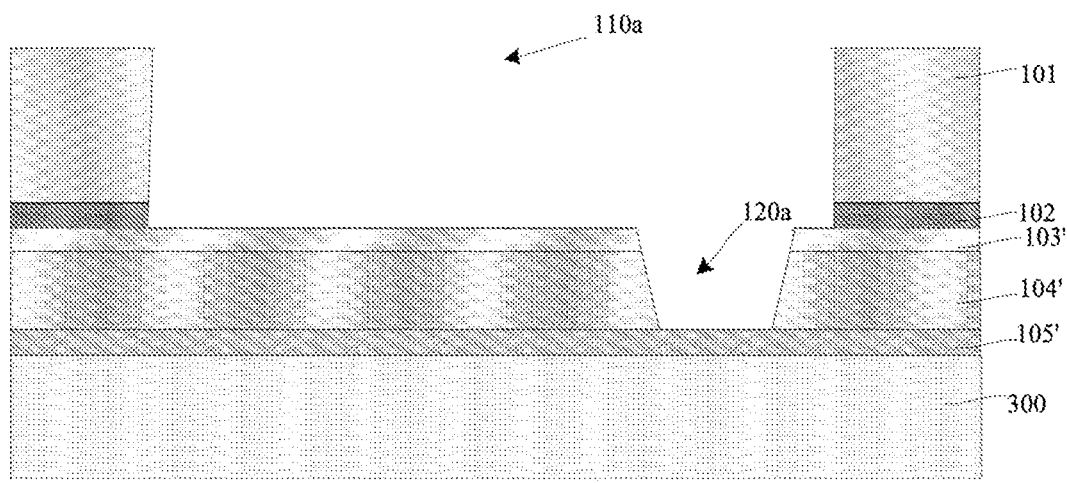
Figure 2F:
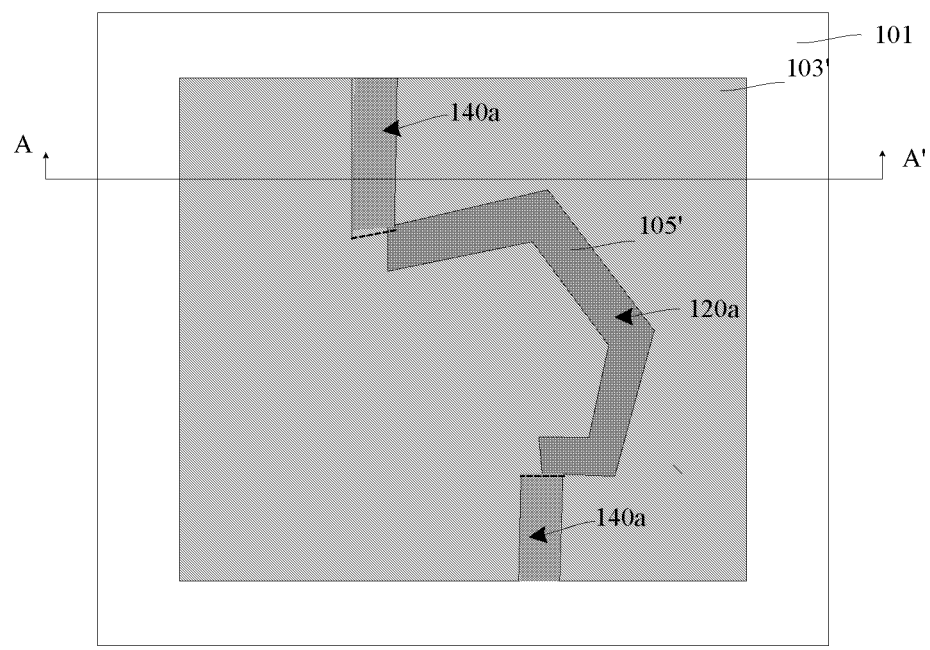
Figure 2G:
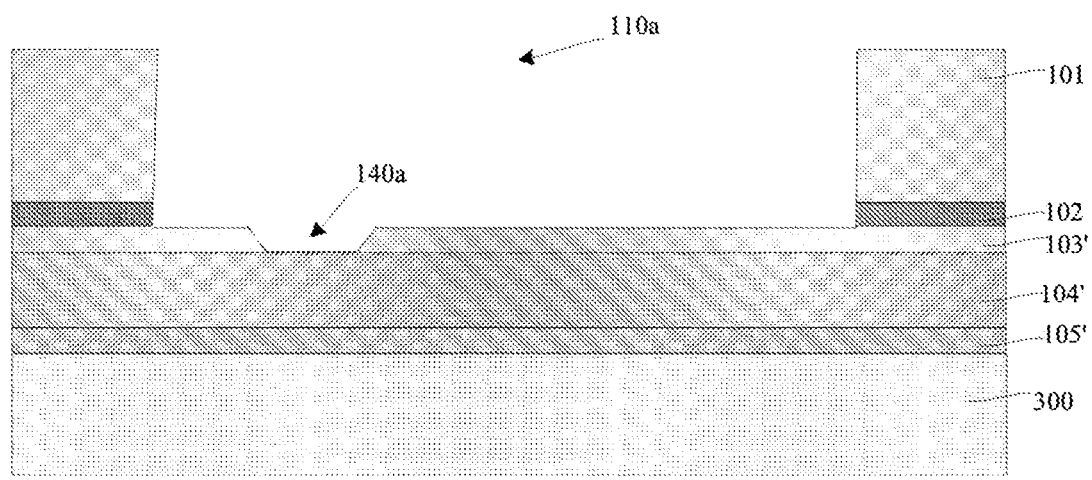
Figure 2H:
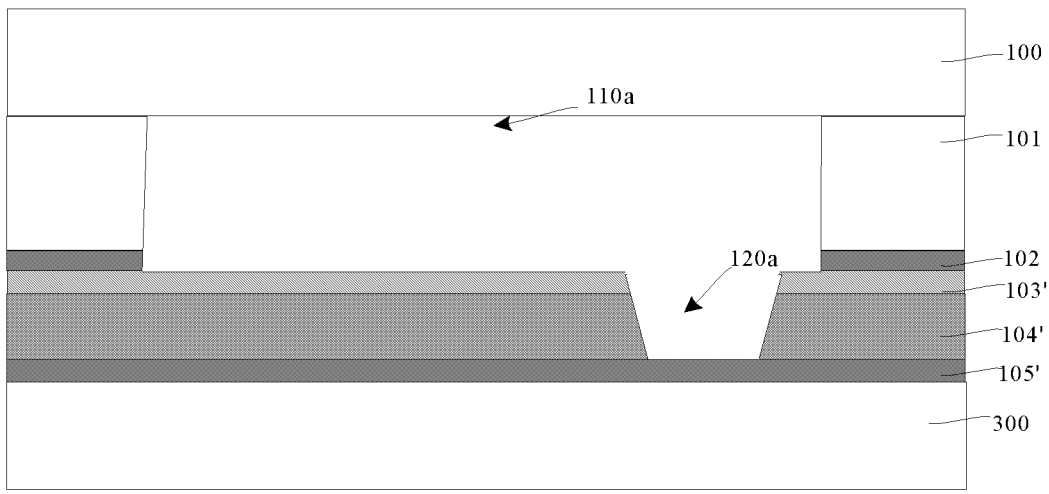
Figure 2I:
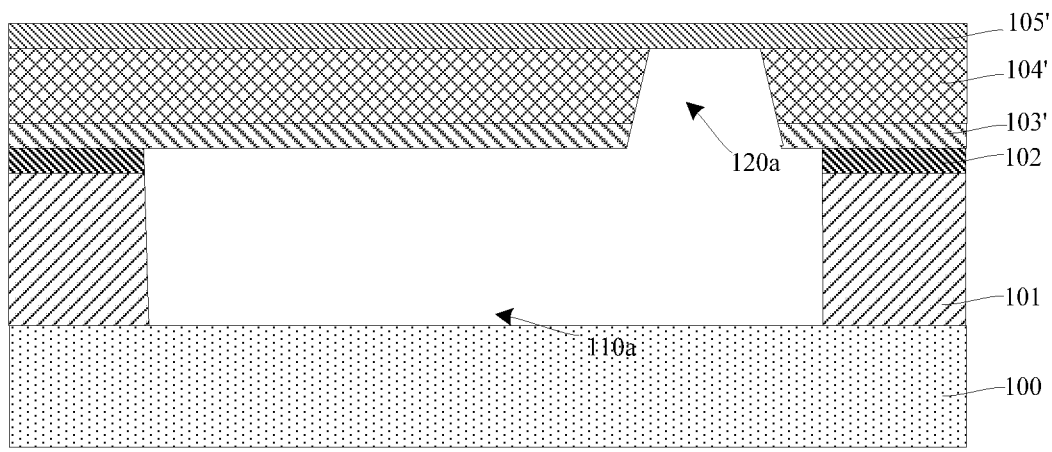
Figure 2J:
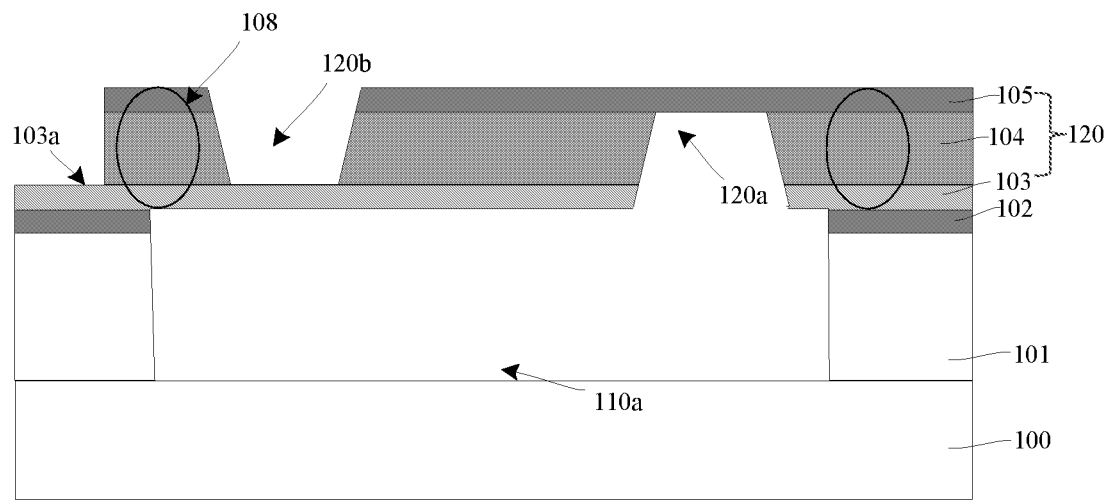
Figure 2K:
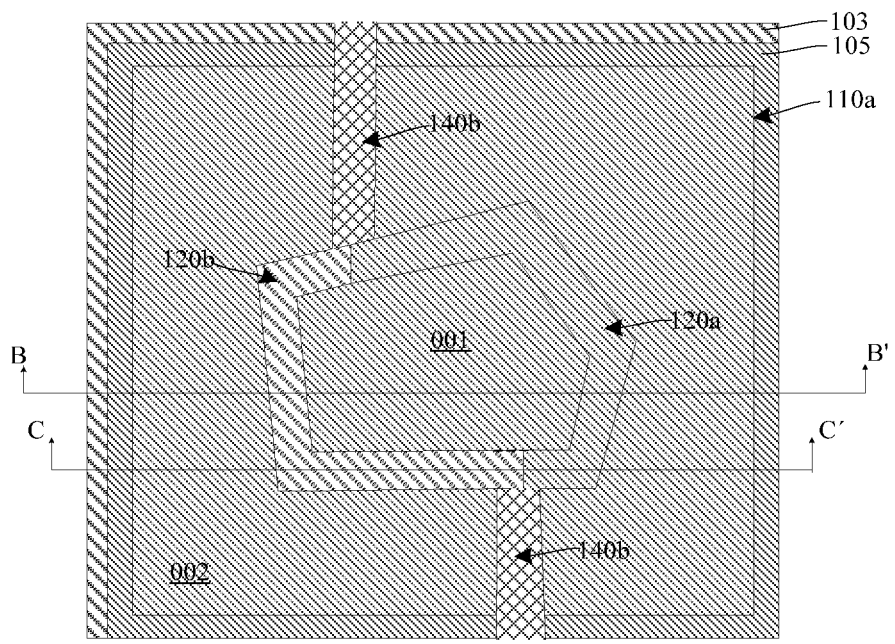
Figure 2L:
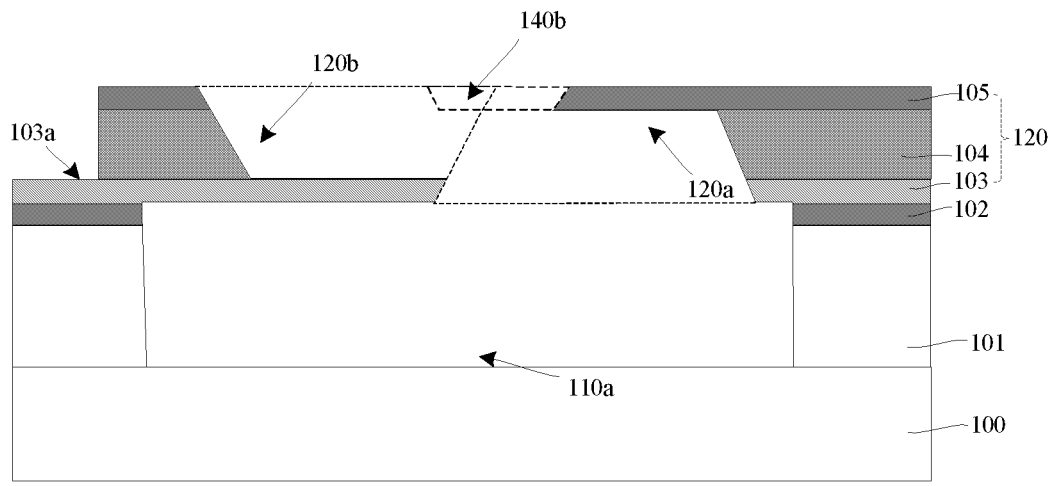
Figure 2M:
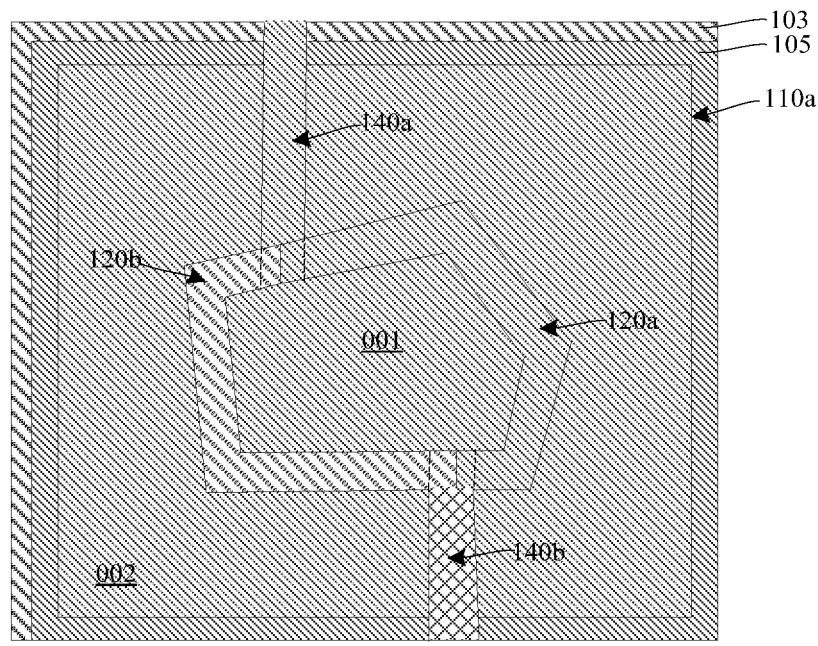

In one embodiment of the present disclosure, the first opening 140a may be located only at a junction of the projections of the first trench 120a and the second trench 120b on the plane where the piezoelectric layer 104 is located; and the second opening 140b may be located at another junction of the projection of the first trench 120a and the second trench 120b on the plane where the piezoelectric layer 104 is located, as shown in FIG. 2M.

In another embodiment of the present disclosure, the first separation structure may be located on the side of the second dividing structure or at the junction of the first dividing structure and the second dividing structure; or the second separation structure may be located on the side of the first dividing structure or at the junction of the first dividing structure and the second dividing structure. That is, both or one of the first trench 120a and the second trench 120b may be in the structure of the film bulk acoustic resonator; and both or one of the first opening 140a and the second opening 140b may be in the structure of the film bulk acoustic resonator. Exemplarily, the first opening 140a may be connected to the first trench 120a, or the second opening 140b may also be connected to the second trench 120b.

Figure 2N:
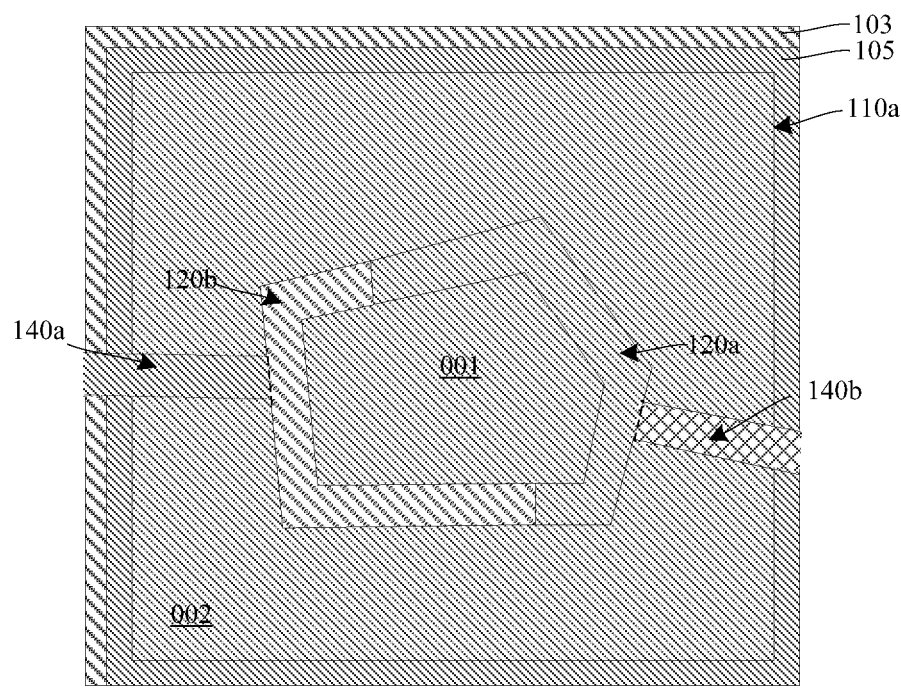

In another embodiment of the present disclosure, on the basis of ensuring that a first electrical connection terminal and a second electrical connection terminal are effectively connected to the effective working area, the first opening 140a may be located on the side of the second trench 120b, and the second opening 140b may also be located on the side of the first trench 120a, as shown in FIG. 2N. Obviously, the first opening 140a and the second opening 140b may also be in other positions of the parasitic working region 002, which may not be limited according to the embodiments of the present disclosure.

In the parasitic working region 002, the first electrode 103 and the second electrode 105 may have a corresponding region along the thickness direction. The first electrode 103 of the parasitic working region 002 may be a surface electrode surrounding the effective working region 001, and the first opening 140a may separate the first electrode 103, such that in at least a portion of the corresponding region, the first electrode 103 of the parasitic working region 002 may be insulated from the first electrode 103 of the effective working region 001. The second electrode 105 of the parasitic working region 002 may be a surface electrode surrounding the effective working region 001, and the second opening 140b may insulate the second electrode 105 of the parasitic working region 002 from the second electrode 105 of the effective working area 001. The first opening 140a or the second opening 140b may divide the first electrode 103 or the second electrode 105 of the parasitic working region 002, thereby reducing the parasitic parameters of the parasitic working region 002.

In one embodiment, the first opening 140a, passing through the first electrode 103, may be obtained by etching the first electrode 103; similarly, the second opening 140b, passing through the first electrode 103, may be obtained by etching the first electrode 103. The first opening 140a and the second opening 140b may be located on the upper and lower sides of the piezoelectric layer 104, respectively. Moreover, an electrical connection terminal 103a of the first electrode 103 may be disposed on the side of the first dividing structure; and an electrical connection terminal 105a of the second electrode 105 may be disposed on the side of the second dividing structure.

In one embodiment, the film bulk acoustic resonator may further include a second support layer 106 disposed on the second electrode 105, where the second support layer 106 may contain a second cavity 110b which is used as an encapsulation cavity; and include a second substrate 200 disposed on the second support layer 106, as shown in FIG. 2N. At least one of the first separation structure and the second separation structure may have an opening that is not filled with the insulation material, and the opening may be connected to each of the first cavity 110a with the second cavity 110b. That is, at least one of the first opening 140a and the second opening 140b may not be filled with the insulation material, such that the first cavity 110a is connected with the second cavity 110b.

Embodiment 2

Figure 4A:
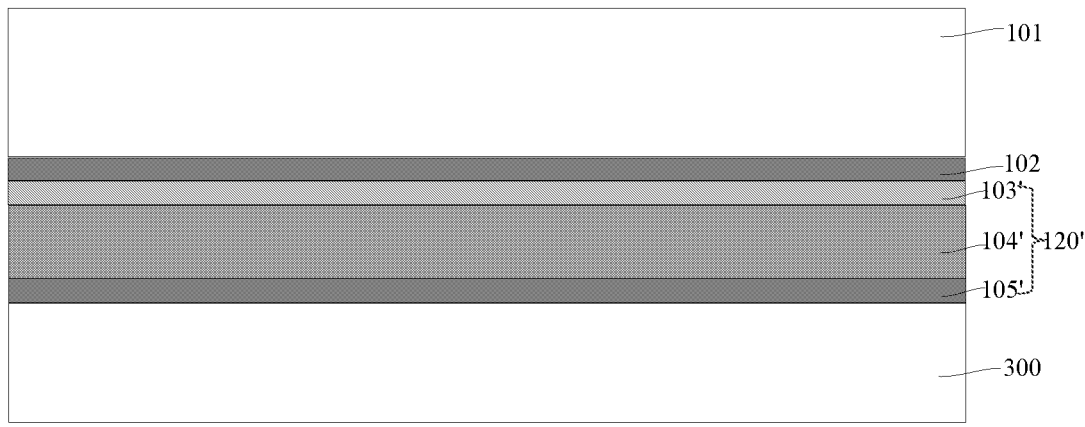
FIGS. 4A-4N illustrate structural schematics corresponding to certain stages of a fabrication method of a film bulk acoustic resonator according to various embodiments of the present disclosure.
Figure 4B:
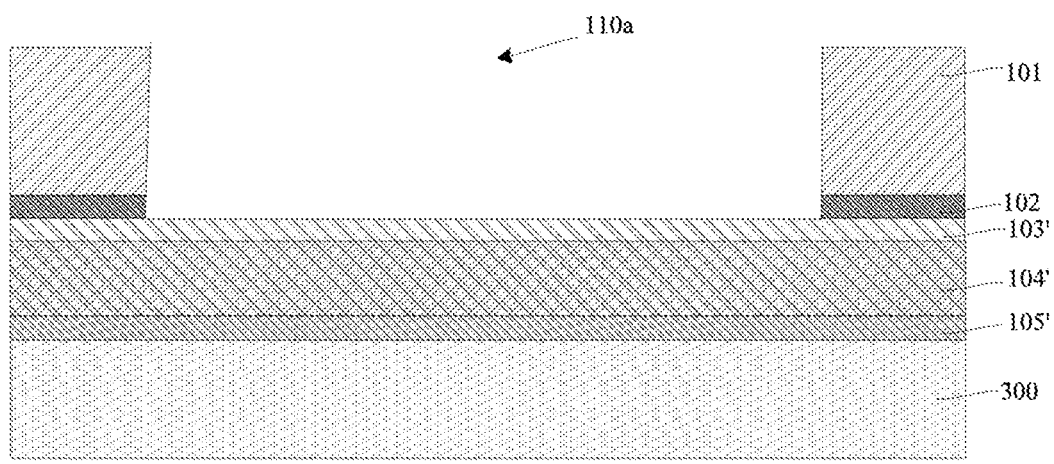
Figure 4C:
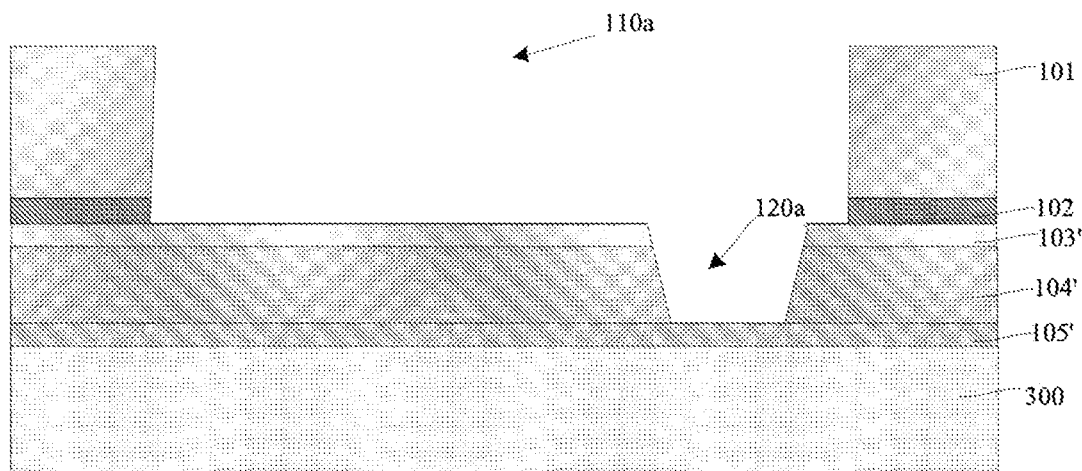
Figure 4D:
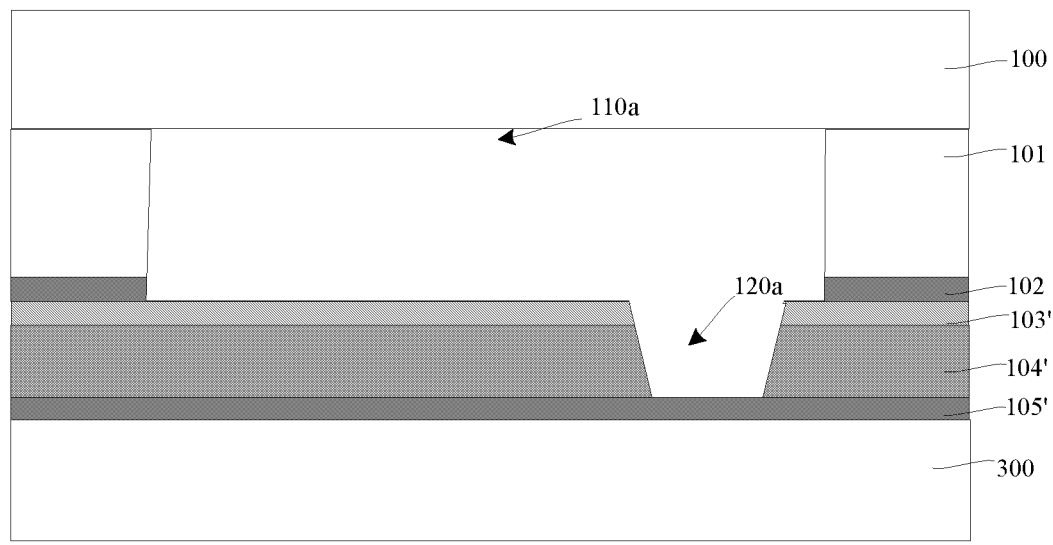
Figure 4E:
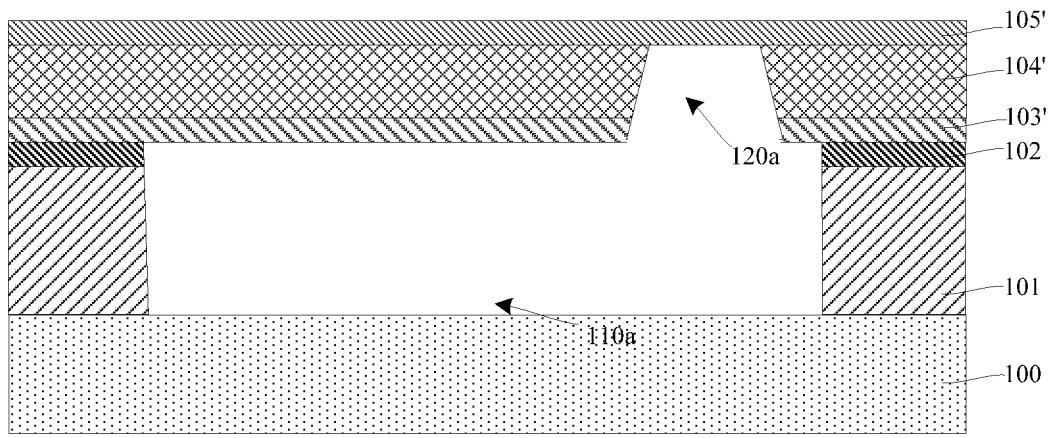
Figure 4F:
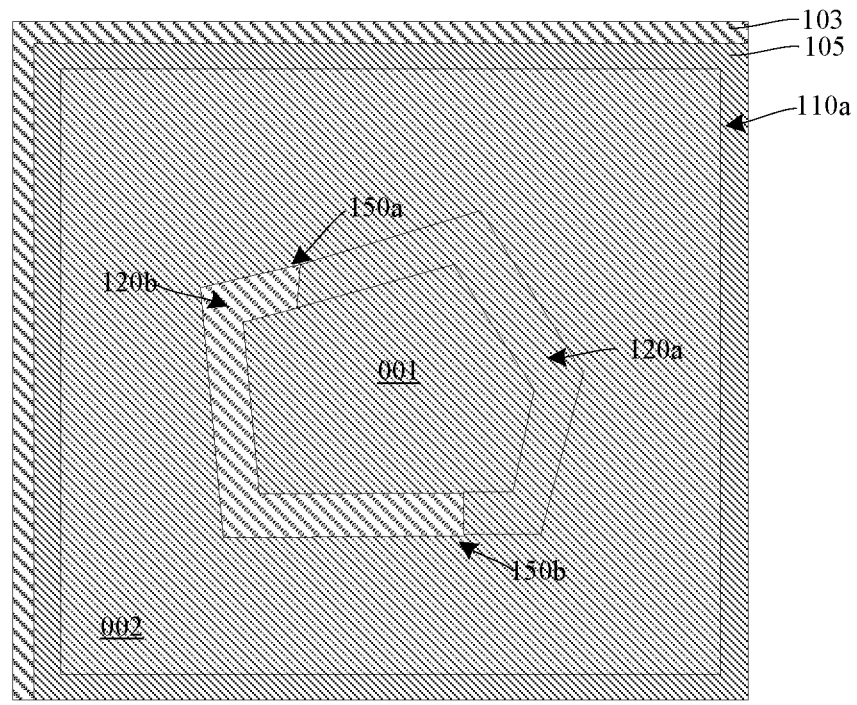
Figure 4G:
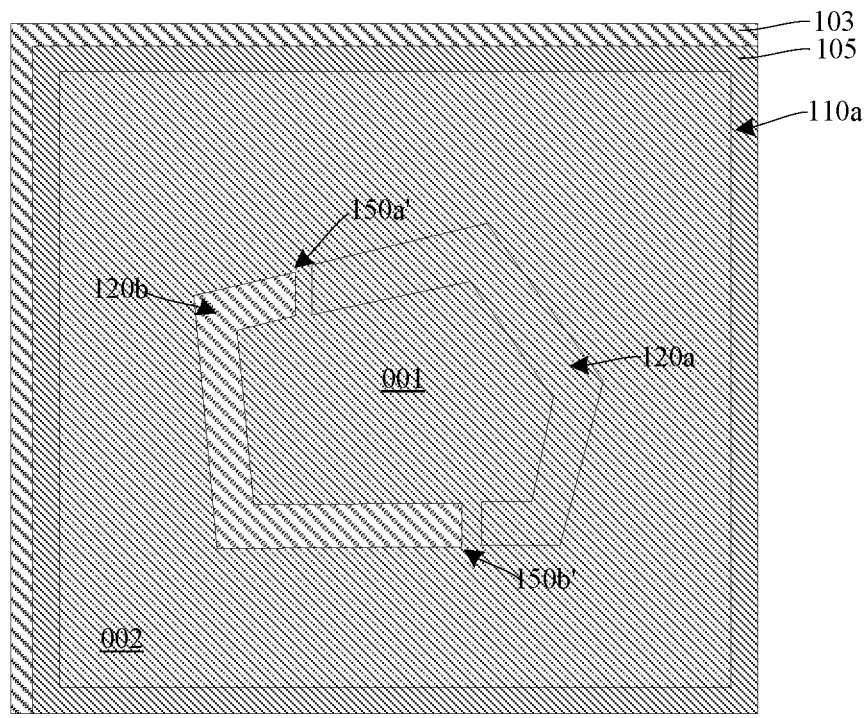
Figure 4H:
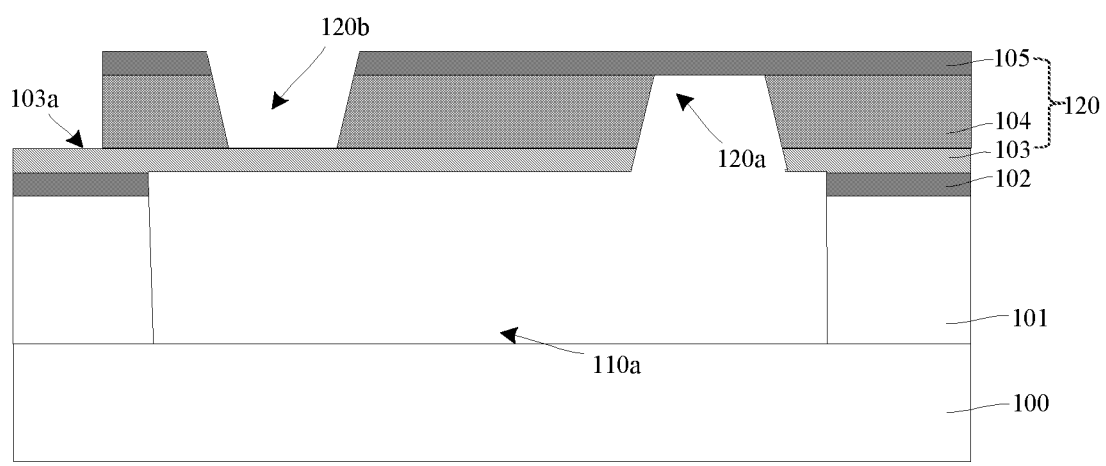

Another embodiment of the present disclosure provides a film bulk acoustic resonator. The difference from the first embodiment is that the first separation structure and the second separation structure may pass through the piezoelectric stacked layer 120. Referring to FIGS. 4H-4K, FIG. 4I illustrates a top view of the film bulk acoustic resonator according to the embodiment of the present disclosure; FIG. 4H illustrates a cross-sectional structural schematic along an EE' axis in FIG. 4I; FIG. 4J illustrates a cross-sectional structural schematic along a DD' axis in FIG. 4I; and FIG. 4K illustrates a cross-sectional structural schematic along an FF' axis in FIG. 4I. The film bulk acoustic resonator in one embodiment may include the first substrate 100 and the first support layer 101 disposed on the first substrate, where the first cavity 110a is disposed in the first support layer 101; and include the piezoelectric stacked layer 120 covering the top opening of the first cavity 110a, where the piezoelectric stacked layer 120 may include the first electrode 103, the piezoelectric layer 104, and the second electrode 105 which are sequentially disposed on the first support layer 101, and the piezoelectric stacked layer 120 may include the effective working region 001 and the parasitic working region 002.

The first trench 120a and the second trench 120b may be disposed in the piezoelectric stacked layer 120. The first trench 120a and the second trench 120b may also be referred to as air trenches. Referring to FIGS. 4F-4H, the first trench 120a and the second trench 120b may be disposed above the first cavity 110a; the first trench 120a may pass through the first electrode 103 and the piezoelectric layer 104 and may be connected to the first cavity 110a; the second trench 120b may pass through the second electrode 105 and the piezoelectric layer 104; and the effective working region 001 may be enclosed by the projections of the first trench 120a and the second trench 120b on the plane where the piezoelectric layer 104 is located.

Referring to FIGS. 4F-4G, the projections of the first trench 120a and the second trench 120b on the plane where the piezoelectric layer 104 is located may be semi-circular or semi-circular-like shapes; and the projections of the first trench 120a and the second trench 120b on the plane where the piezoelectric layer 104 is located may be exactly connected or close to be connected. That is, the projections of the first trench 120a and the second trench 120b on the plane where the piezoelectric layer 104 is located may form a completely closed ring or an approximately closed ring. The junctions of the projections of the first trench 120a and the second trench 120b on the plane where the piezoelectric layer 104 is located may include a first junction 150a and a second junction 150b. The ring region, formed by the projections of the first trench 120a and the second trench 120b on the plane where the piezoelectric layer 104 is located, may be the effective working region 001 of the film bulk acoustic resonator. The first trench 120a and the second trench 120b may be located at the periphery of the effective working region 001. The ring formed by the combination of two projections of the first trench 120a and the second trench 120b on the plane where the piezoelectric layer 104 is located may be equally divided (at this point, the first trench 120a and the second trench 120b are separated on two sides of the effective working region 001 and all portions are completely opposite), and may be unevenly divided (at this point, the first trench 120a and the second trench 120b are separated on two sides of the effective working region 001 and only certain portions are opposite).

Figure 4I:
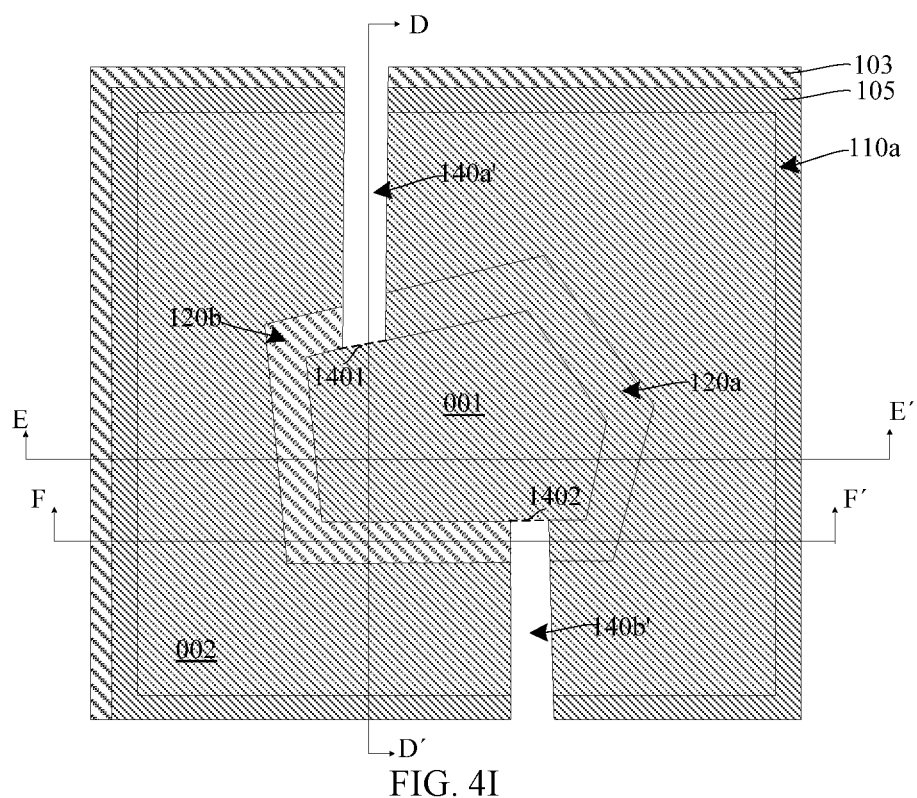
Figure 4J:
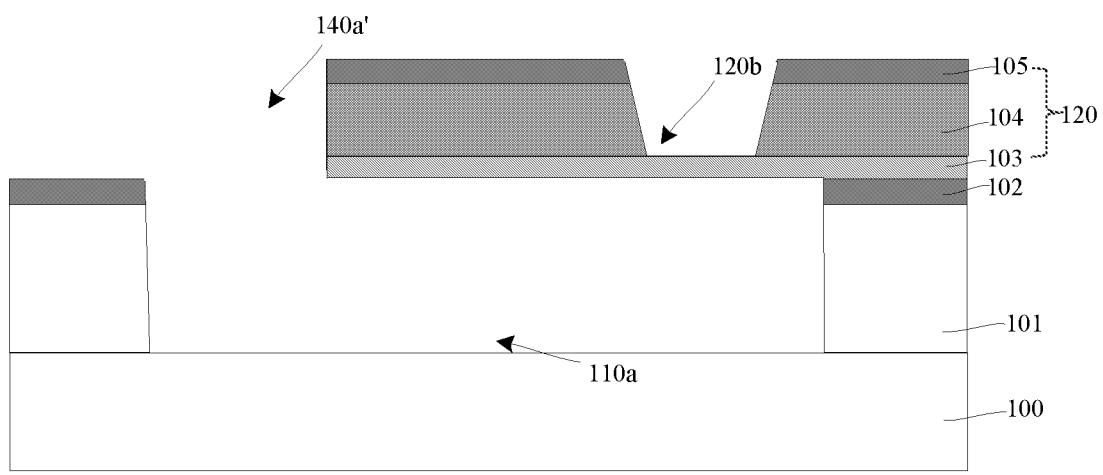
Figure 4K:
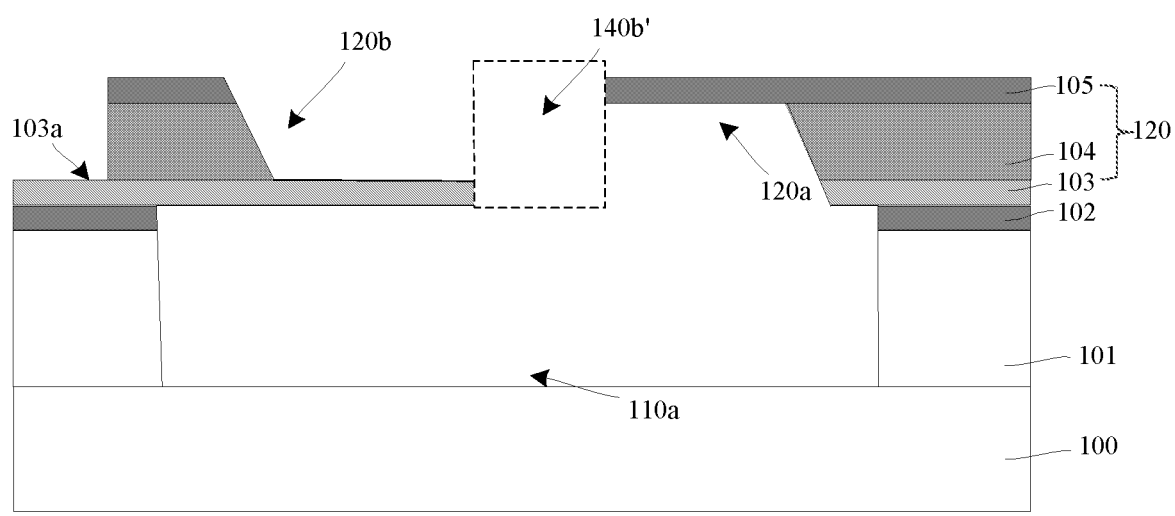

The cross-sections of the first trench 120a and the second trench 120b along the EE' axis in FIG. 4I may be trapezoidal or trapezoid-like shapes. In one embodiment, the ring (the effective working region 001) formed by the projections of the first trench 120a and the second trench 120b on the plane where the piezoelectric layer 104 is located may be an exactly connected pentagonal ring; and the polygon may not include any pair of relatively parallel sides. In other embodiments of the present disclosure, the ring formed by the projections of the first trench 120a and the second trench 120b on the plane where the piezoelectric layer 104 is located may also be a nearly closed pentagonal ring with openings (a first junction opening 150a' and a second junction opening 150b') at two projection junctions, as shown in FIG. 4G.

It can be seen from the working principle of the film bulk acoustic resonator that the working region of the film bulk acoustic resonator may not only include the ring (pentagonal ring) enclosed by the projections of the first trench 120a and the second trench 120b on the plane where the piezoelectric layer 104 is located, that is, the effective working region of the film bulk acoustic resonator is 001; and may also include an region outside the ring region in the first cavity 110a, that is, the parasitic working region 002 of the film bulk acoustic resonator. In order to reduce the parasitic parameters generated in the parasitic working region 002 and improve the device performance, the separation structures may be disposed at the junctions of the projections of the first trench 120a and the second trench 120b on the plane where the piezoelectric layer 104 is located in one embodiment.

For example, the separation structures may include a first separation structure and a second separation structure. The first separation structure may include a first opening 140a', and the second separation structure may include a second opening 140b'. The first opening 140a' and the second opening 140b' may pass through the first electrode 103, the piezoelectric layer 104, and the second electrode 105 along the thickness direction. The first opening 140a' may be disposed at the first junction 150a and extend along a horizontal direction (a direction parallel to the first substrate) to the boundary of the first electrode 103 adjacent to the first junction 150a. The second opening 140b' may be disposed at the second junction 150b and extend along the horizontal direction to the boundary of the first electrode 103 adjacent to the first junction 150b. In one embodiment, the longitudinal cross-sectional shapes of the first opening 140a' and the second opening 140b' may both be rectangular shapes, and the top view shapes of the first opening 140a' and the second opening 140b' be both be elongated shapes. However, in specific implementation, the longitudinal cross-sectional shapes of the first opening 140a' and the second opening 140b' may also be shapes other than rectangles, such as regular trapezoids or inverted trapezoids; and the top-view shapes of the first opening 140a' and the second opening 140b' may also be shapes other than elongated shapes, such as pentagons, hexagons, and the like. An overlapped portion 1401 between the projection of the first opening 140*a*' on the plane where the piezoelectric layer 104 and the circular polygon may not in parallel with an overlapped portion 1402 between the projection of the second opening 140*b*' on the plane where the piezoelectric layer 104 and the circular polygon, which may further ensure that the polygonal ring enclosed by the first trench 120*a*, the second trench 120*b*, and the projections of the first opening 140*a*' and the second opening 140*b*', which are at the projection junctions, on the plane where the piezoelectric layer 104 is located may not include any pair of relatively parallel sides, thereby reducing the propagation loss of the acoustic waves in the effective working region. Moreover, in one embodiment, the shapes and line widths of the first opening 140*a*' and the second opening 140*b*' may be same. However, in specific implementation, the shapes of the first opening 140*a*' and the second opening 140*b*' may be different; or the shapes of the first opening 140*a*' and the second opening 140*b*' may be same, but line widths of the first opening 140*a*' and the second opening 140*b*' may be different.

When the ring, formed by the projections of the first trench 120*a* and the second trench 120*b* on the plane where the piezoelectric layer 104 is located, has junction openings (the first junction opening 150*a*' and the second junction opening 150*b*') at two projection junctions, the projection of the first opening 140*a*' on the plane where the piezoelectric layer 104 is located may cover the first junction opening 150*a*', and the projection of the second opening 140*b*' on the plane where the piezoelectric layer 104 is located may cover the second junction opening 150*b*'. Moreover, the projections of the first opening 140*a*' and the second opening 140*b*' at the projection junctions on the plane where the piezoelectric layer 104 is located may not be in parallel with each other. Furthermore, the circular polygon enclosed by the first trench 120*a*, the second trench 120*b*, and the projections of the first opening 140*a*' and the second opening 140*b*' at the projection junctions on the plane where the piezoelectric layer 104 is located may not include any pair of relatively parallel sides, thereby reducing the propagation loss of the acoustic waves in the effective working region. In addition, in order to prevent a photoresist, a wet etching solvent and the like from entering the first cavity 110*a* to pollute and damage the first cavity 110*a* and further affect the device performance, the first electrode 103, the piezoelectric layer 104 and the second electrode 105 may be dry etched to form the first opening 140*a*' and the second opening 140*b*'. The dry etching may be, for example, inductively coupled plasma (ICP) etching, reactive ion etching (RIE), or the like.

In one embodiment, the first cavity 110*a* may be formed by etching the first support layer 101 through an etching process. The shape of the bottom surface of the first cavity 110*a* may be a rectangle, a circle, an ellipse, or a polygon other than a rectangle, such as a pentagon, a hexagon, and the like.

The overlapped region of the first electrode 103, the piezoelectric layer 104 and the second electrode 105 along the thickness direction may be directly above the first cavity 110*a*. An etch stop layer 102 may be also disposed between the first support layer 101 and the first electrode 103, and the material of the etch stop layer 102 may include, but may not be limited to, silicon nitride ($Si_3N_4$) and silicon oxynitride (SiON). On the one hand, the etch stop layer 102 may be used to increase the structural stability of the finally fabricated film bulk acoustic resonator; on the other hand, the etch stop layer 102 may have a lower etch rate compared with the first support layer 101, which may prevent over-etching during the process of etching the first support layer 101 to form the first cavity 110*a*, and protect the surface of the first electrode 103 under the etch stop layer 102 from being damaged, thereby improving the device performance and reliability. It should be noted that the first electrode 103 may include the electrical connection terminal 103*a* (e.g., an edge region) which is not covered by the piezoelectric layer 104 and the second electrode 105, thereby facilitating subsequent input and output of electrical signals.

Figure 4L:
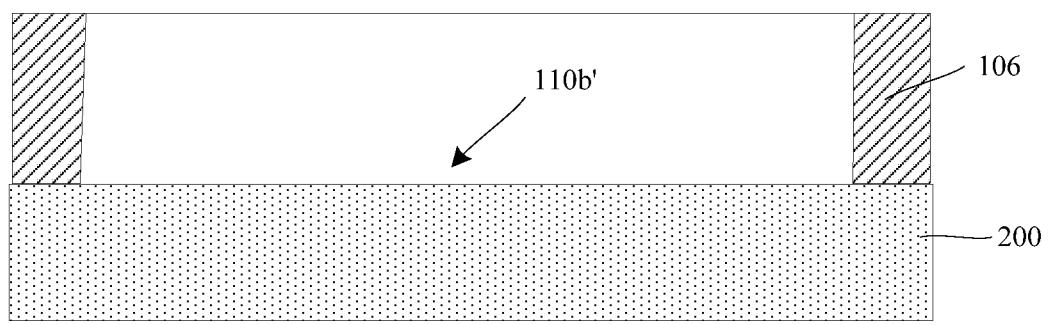
Figure 4M:
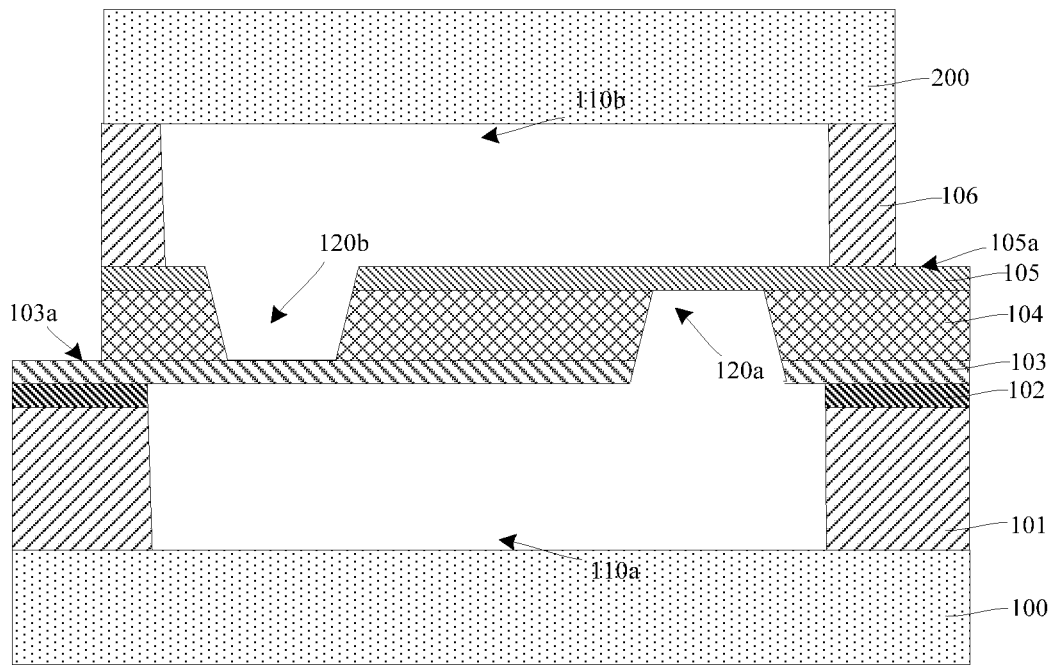
Figure 4N:
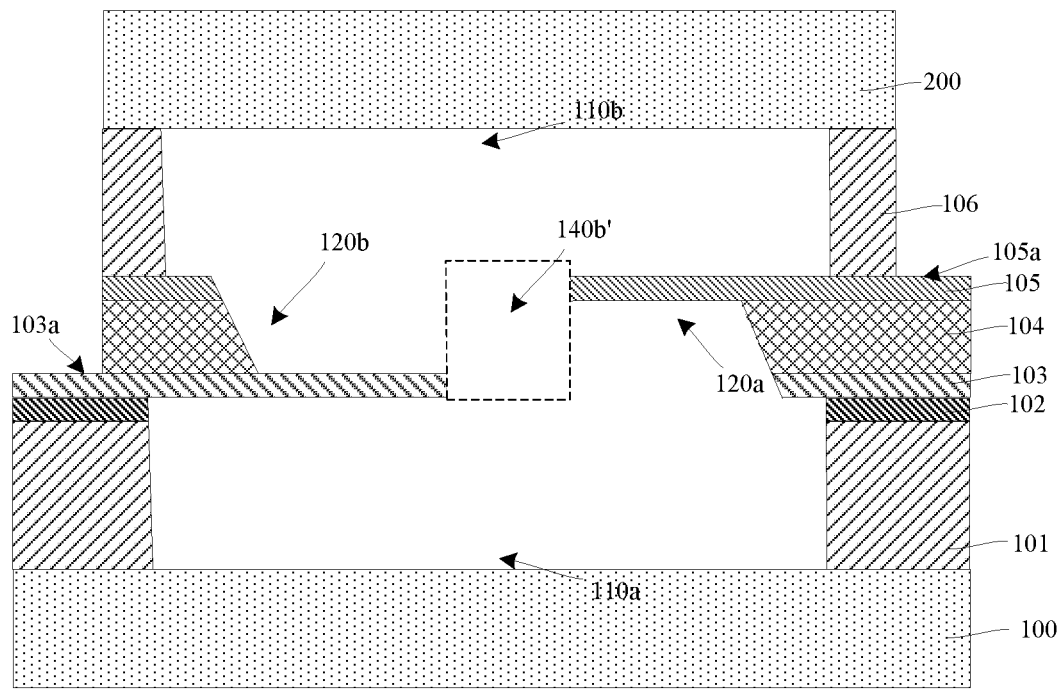

Referring to FIGS. 4M-4N, the second support layer 106 and the second substrate 200 may be further provided on the second electrode 105, and the second cavity 110*b* may be disposed in the second support layer 106. The second cavity 110 *b* may be disposed oppositely to the first cavity 110 *a*; and the second cavity 110 *b* may be formed by etching the second support layer 106. In one embodiment, the shape of the bottom surface of the second cavity 110*b* may be a rectangular shape. However, in other embodiments of the present disclosure, the shape of the bottom surface of the second cavity 110*b* may also be a circle, an ellipse, or a polygon other than a rectangle, such as a pentagon, a hexagon, and the like. In one embodiment, the second cavity 110*b* and the first cavity 110*a* may be respectively disposed on the upper and lower sides of the piezoelectric stacked layer 120. Preferably, the second cavity 110*b* and the first cavity 110*a* may be disposed symmetrically with respect to the piezoelectric stacked layer 120. The material of the second substrate 200 may be same as the material of the first substrate 100, or may be other suitable substrates known to those skilled in the art. It should be noted that the second electrode 105 may include an edge region which is not covered by the second support layer 106 as an electrical connection terminal 105*a* of the second electrode, thereby facilitating subsequent input and output of electrical signals.

In one embodiment, the film bulk acoustic resonator may further include the signal input and output structures. For example, the signal input and output structures may a first soldering pad and a second soldering pad which are connected to the first electrode 103 and the second electrode 105, respectively. For example, the first soldering pad may be connected to the electrical connection terminal 103*a* of the first electrode 103 which is not covered by the piezoelectric layer 104 and the second electrode 105; and the second soldering pad may be connected to the electrical connection terminal 105*a* of the second electrode 105 which is not covered by the second support layer 106.

In one embodiment, the first separation structure and the second separation structure may divide the parasitic working region 002 outside the effective working region 001, and effectively block the propagation of transverse waves in the parasitic working region 002, which may improve the acoustic wave loss, reduce the parasitic parameters, and improve the quality factor of the resonator, thereby improving the device performance. Meanwhile, the first cavity 110*a* and the second cavity 110*b*, located on the upper and lower sides of the piezoelectric stacked layer 120, may be connected to each other through the arrangement of the first separation structure and the second separation structure, which may release the pressure of the first cavity under the piezoelectric stacked layer structure, avoid bending of the effective working region of the film bulk acoustic resonator due to pressure, maintain the effective working region to be relatively flat, thereby further improving the quality factor of the film bulk acoustic resonator.

Embodiment 3

The embodiment of the present disclosure provides a fabrication method of a film bulk acoustic resonator. FIG. 1 illustrates a flowchart of the fabrication method of the film bulk acoustic resonator according to the embodiment of the present disclosure. Referring to FIG. 1, the fabrication method of the film bulk acoustic resonator may include:

- S01, providing a third substrate 300 and forming a piezoelectric stacked layer structure 120' on the third substrate 300, where the piezoelectric stacked layer structure 120' may include a second electrode layer 105', a piezoelectric material layer 104', and a first electrode layer 103' which are sequentially formed on the third substrate 300;
- S02, forming the first support layer 101 on the first electrode layer 103' and forming the first cavity 110a which may pass through the first support layer 101, in the first support layer 101;
- S03, after forming the first cavity, etching the first electrode layer 103' to form the first opening 140a, where the first opening 140a may pass through the first electrode layer 103' along the thickness direction;
- S04, providing the first substrate 100 and bonding the first substrate 100 with the first support layer 101;
- S05, removing the third substrate 300; and
- S06, patterning the piezoelectric stacked layer structure 120' to form the first electrode 103, the piezoelectric layer 104, the second electrode 105, and dividing the piezoelectric stacked layer structure into the effective working region 001 and the parasitic working region 002, where in the parasitic working region 002, the first electrode 103 and the second electrode 105 may have the corresponding region along the thickness direction; and in at least a portion of the corresponding region, the first electrode 103 of the parasitic working region 002 may be insulated from the first electrode 103 of the effective working region 001; and/or
- etching the second electrode 105 to form the second opening, such that in at least a portion of the corresponding region, the second electrode 105 of the parasitic working region 002 may be insulated from the second electrode 105 of the effective working region 001.

Figure 2O:
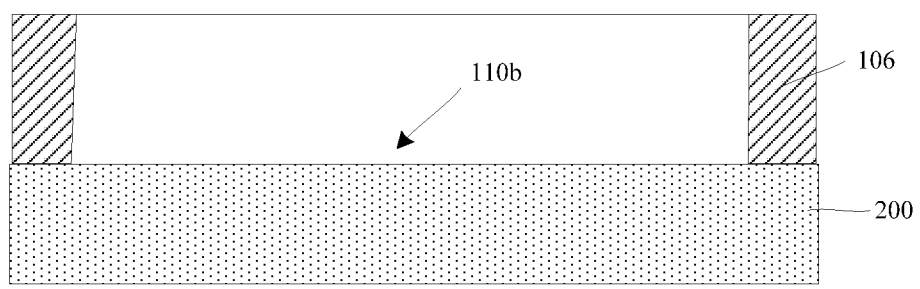
Figure 2P:
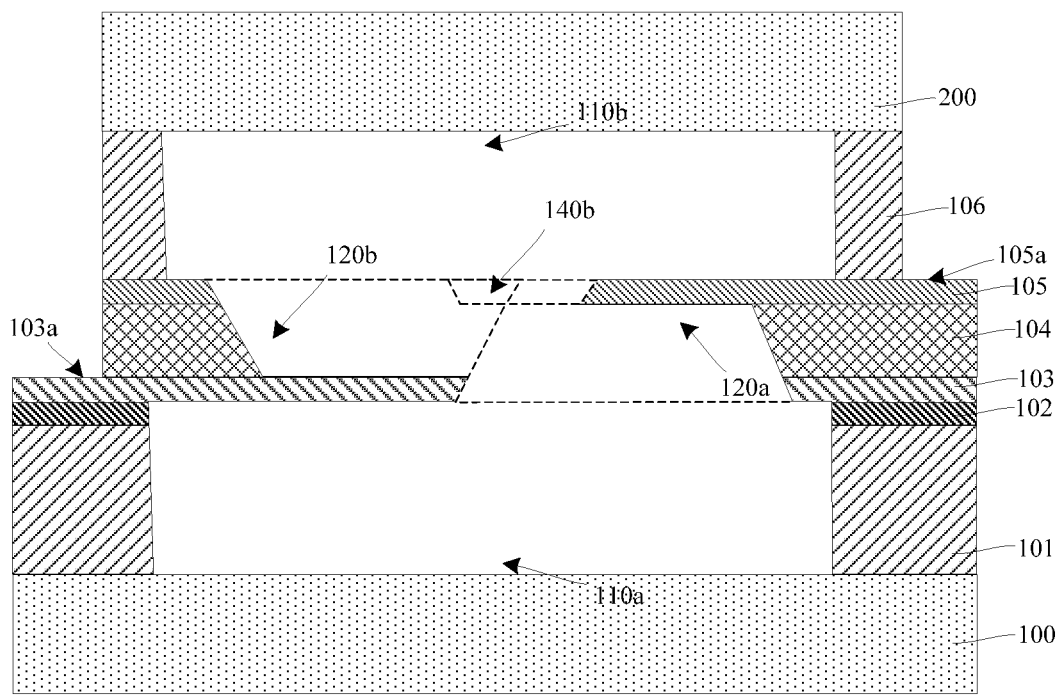

FIGS. 2A-2P illustrate structural schematics corresponding to certain stages of the fabrication method of the film bulk acoustic resonator according to the embodiment of the present disclosure. The fabrication method of the film bulk acoustic resonator provided in one embodiment is described in detail with reference to FIG. 1 and FIGS. 2A-2P hereinafter.

Referring to FIGS. 2A-2B, step S01 may be performed to provide the third substrate 300 and form the piezoelectric stacked layer structure 120' on the third substrate 300. The piezoelectric stacked layer structure 120' may include the second electrode layer 105', the piezoelectric material layer 104', and the first electrode layer 103'. The third substrate 300 may be any suitable substrate known to those skilled in the art. For example, the third substrate 300 may be at least one of the following materials: silicon (Si), germanium (Ge), silicon germanium (SiGe), silicon carbon (SiC), silicon germanium (SiGeC), indium arsenide (InAs), gallium arsenide (GaAs), indium phosphide (InP), other IIIN compound semiconductors, and a multilayer structure composed of such semiconductors; or silicon-on-insulator (SOI), silicon-on-insulator (SSOI), silicon-germanium-on-insulator (S—SiGeOI), silicon germanium-on-insulator (SiGeOI), and germanium-on-insulator (GeOI); or a double side polished wafer (DSP), a ceramic substrate such as alumina, a quartz or glass substrate, and the like. The piezoelectric material layer 104' may be located between the first electrode layer 103' and the second electrode layer 105'; and the first electrode layer 103' and the second electrode layer 105' may be disposed oppositely. The first electrode layer 103' may be used as an input electrode or an output electrode which receives or provides electrical signals such as radio frequency (RF) signals. For example, when the second electrode layer 105' is used as the input electrode, the first electrode layer 103' may be used as the output electrode; when the second electrode layer 105' is used as the output electrode, the first electrode layer 103' may be used as the input electrode; and the piezoelectric material layer 104' may convert the electrical signal inputted through the first electrode layer 103' or the second electrode layer 105' into the bulk acoustic wave. For example, the piezoelectric material layer 104' may convert the electrical signal into the bulk acoustic wave through physical vibration.

A release layer (not shown) may also be formed between the third substrate 300 and the piezoelectric stacked layer structure 120' (the second electrode 105). The release layer may be used as a protective layer of the third substrate 300 to avoid the influence of the piezoelectric stacked layer structure 120' of the film bulk acoustic resonator formed subsequently on the third substrate 300; meanwhile, in the subsequent peeling process, the third substrate 300 may be separated from the piezoelectric stacked layer structure 120' formed subsequently by the manner of removing the release layer, which is beneficial for rapidly peeling off the third substrate 300 and improving the process manufacturing efficiency. The material of the release layer may include, but may not be limited to, at least one of silicon dioxide ($SiO_2$), silicon nitride ($Si_3N_4$), aluminum oxide ($Al_2O_3$), and aluminum nitride (AlN). The release layer may be formed by a process including a chemical vapor deposition process, a magnetron sputtering process, an evaporation process, and the like. In one embodiment, the third substrate 300 may be monocrystalline silicon, for example, a P-type high resistance monocrystalline silicon wafer with a <100> crystal orientation; and the material of the release layer may be silicon dioxide ($SiO_2$).

The second electrode layer 105' and the first electrode layer 103' may use any suitable conductive materials or semiconductor materials known in the existing technology. The conductive material may be a metal material with conductive properties, such as one metal or a stacked layer of the following metals including molybdenum (Mo), aluminum (Al), copper (Cu), tungsten (W), tantalum (Ta), platinum (Pt), ruthenium (Ru), rhodium (Rh), iridium (Ir), chromium (Cr), titanium (Ti), gold (Au), osmium (Os), rhenium (Re), palladium (Pd), and the like; and the semiconductor material may include, for example, Si, Ge, SiGe, SiC, SiGeC, and the like. The second electrode layer 105' and the first electrode layer 103' may be formed by a physical vapor deposition process or a chemical vapor deposition process such as a magnetron sputtering process, an evaporation process, and the like. The material of the piezoelectric material layer 104' may be one or a combination of piezoelectric materials with wurtzite crystal structure, including aluminum nitride (AlN), zinc oxide (ZnO), lead zirconate titanate (PZT), lithium niobate ($LiNbO_3$), quartz (Quartz), potassium niobate ($KNbO_3$), lithium tantalate ($LiTaO_3$), and the like. When the piezoelectric layer 104 includes aluminum nitride (AlN), the piezoelectric material layer 104' may also include rare earth metals, such as at least one of scandium (Sc), erbium (Er), yttrium (Y), and lanthanum (La). Moreover, when the piezoelectric material layer 104' includes aluminum nitride (AlN), the piezoelectric material layer 104' may also include transition metals, such as at least one of zirconium (Zr), titanium (Ti), manganese (Mn), and hafnium (Hf). The piezoelectric material layer 104' may be deposited by any suitable process known to those skilled in the art, such as a chemical vapor deposition process, a physical vapor deposition process, or an atomic layer deposition process. Preferably, in one embodiment, the second electrode layer 105' and the first electrode layer 103' may be made of metallic molybdenum (Mo); and the piezoelectric material layer 104' may be made of aluminum nitride (AlN).

The shapes of the second electrode layer 105', the piezoelectric material layer 104', and the first electrode layer 103' may be same or different, and the areas of the second electrode layer 105', the piezoelectric material layer 104', and the first electrode layer 103' may be same or different. In one embodiment, the shapes and areas of the second electrode layer 105', the piezoelectric material layer 104', and the first electrode layer 103' are same, where the shapes may all be polygonal, such as square.

In one embodiment, before forming the first support layer 101, the etch stop layer 102 may also be formed on the first electrode layer 103', and the material of the etch stop layer 102 may include, but may not be limited to, silicon nitride ($Si_3N_4$) and silicon oxynitride (SiON). The etch stop layer 102 has a lower etch rate compared with the first support layer 101 formed subsequently, which may prevent over-etching when the first support layer 101 is subsequently etched to form the first cavity 110a and may protect the surface of the first electrode layer 103' under the etch stop layer 102 from being damaged. In other embodiments, the etch stop layer may not be formed.

Referring to FIGS. 2C-2D, step S02 may be performed to form the first support layer 101 over the first electrode layer 103' and form the first cavity 110a, which may pass through the first support layer 101, in the first support layer 101. For example, the first support layer 101 may be first formed on the first electrode 103 by a chemical deposition process, as shown in FIG. 2C. The material of the first support layer 101 may be, for example, one or a combination of silicon dioxide ($SiO_2$), silicon nitride ($Si_3N_4$), aluminum oxide ($Al_2O_3$) and aluminum nitride (AlN). In one embodiment, the material of the first support layer 101 may be silicon dioxide ($SiO_2$). Then, the first support layer 101 may be etched by an etching process to form the first cavity 110a to expose a portion of the first electrode layer 103', as shown in FIG. 2D. The etching process may be a wet etching process or a dry etching process; and the dry etching process may be preferably used. The dry etching process may include, but may not be limited to, reactive ion etching (ME), ion beam etching, plasma etching, or laser cutting. The depth and shape of the first cavity 110a may depend on the depth and shape of the first cavity 110a required by the bulk acoustic resonator to be fabricated, that is, the depth of the first cavity 110a may be determined by the formed thickness of the first support layer 101. The shape of the bottom surface of the first cavity 110a may be a rectangle or a polygon other than a rectangle, such as a pentagon, a hexagon, an octagon, and the like, and may also be a circle or an ellipse. In one embodiment of the present disclosure, the longitudinal cross-sectional shape of the first cavity 110a may also be a spherical crown with a wide top and a narrow bottom, that is, the longitudinal cross-section may be U-shaped.

Referring to FIGS. 2E-2G, step S03 may be performed to, after forming the first cavity 110a, etch the first electrode layer 103' to form the first opening 140a, where the first opening 140a may pass through the first electrode layer 103' along the thickness direction.

Before forming the first opening 140a, the first electrode layer 103' and the piezoelectric material layer 104' may be etched to form the first trench 120a in the first cavity 110a, as shown in FIG. 2E. The projection of the first trench 120a on the plane where the piezoelectric layer 104 is located may be a half-ring or half-ring-like polygon. FIG. 2F illustrates a top view after the first opening 140a is formed by etching according to the embodiment of the present disclosure; and FIG. 2G illustrates a cross-sectional structural schematic along a line AA' in FIG. 2F.

Referring to FIGS. 2F-2G, the first electrode layer 103' may be etched to form the first opening 140a, and the first opening 140a may pass through the first electrode layer 103' along the thickness direction. The first opening 140a may be formed on the side where the second trench 120b is subsequently formed; and the first opening 140a may also be formed at the junction of the first trench 120a and the second trench 120b formed subsequently. In one embodiment, the first opening 140a may be formed at the junction of the projections of the first trench 120a and the subsequently formed second trench 120b on the plane where the piezoelectric layer 104 is located and extend till the first electrode 103 is divided, as shown in FIG. 2F.

Referring to FIG. 2H, step S04 may be performed to bond the first substrate 100 with the first support layer 101. The first substrate 100 may be any suitable substrate known to those skilled in the art. For example, the first substrate 100 may be at least one of the following materials: silicon (Si), germanium (Ge), silicon germanium (SiGe), silicon carbon (SiC), silicon germanium (SiGeC), indium arsenide (InAs), gallium arsenide (GaAs), indium phosphide (InP), other IIIN compound semiconductors, and a multilayer structure composed of such semiconductors; or silicon-on-insulator (SOI), silicon-on-insulator (SSOI), silicon-germanium-on-insulator (S—SiGeOI), silicon germanium-on-insulator (SiGeOI), and germanium-on-insulator (GeOI); or a double side polished wafer (DSP), a ceramic substrate such as alumina, a quartz or glass substrate, and the like. The bonding of the first substrate 100 and the first support layer 101 may be implemented by a thermocompression bonding process. After the bonding process is completed, the above-mentioned film bulk acoustic resonator after the bonding process may be turned over for subsequent steps.

Referring to FIG. 2I, step S05 may be performed to remove the third substrate 300. In one embodiment, the third substrate 300 may be removed through a thinning process, a heat release process, and a peeling process. For example, the release layer may be made of a material including a dielectric material, and the release layer and the third substrate 300 may be removed by the thinning process, such as a mechanical polishing process; the release layer may be a light solidification adhesive, and the light solidification adhesive may be removed by using a chemical agent to remove the third substrate 300; and the release layer may be a thermally melt adhesive, and the third substrate 300 may be removed through a heat release process by removing adhesiveness of the thermally metal adhesive. In other embodiments of the present disclosure, the third substrate 300 may also be removed in other manners, which are not listed in detail herein.

FIG. 2J illustrates a cross-sectional structural schematic along a BB' axis in FIG. 2K, and FIG. 2L illustrates a cross-sectional structural schematic along a CC' axis in FIG. 2K. Referring to FIGS. 2J-2L, step S06 may be performed to pattern the piezoelectric stacked layer structure 120' to form the first electrode 103, the piezoelectric layer 104, the second electrode 105, and to divide the piezoelectric stacked layer structure into the effective working region 001 and the parasitic working region 002. In the parasitic working region 002, the first electrode 103 and the second electrode 105 may have the corresponding region along the thickness direction, where in at least a portion of the corresponding region, the first electrode 103 of the parasitic working region 002 may be insulated from the first electrode 103 of the effective working region 001. Or the second electrode 105 may be etched to form the second opening 140b, such that in at least a portion of the corresponding region, the second electrode 105 of the parasitic working region 002 may be insulated from the second electrode 105 of the effective working region 001. In other embodiments, while keeping the first electrode 103 of the parasitic working region 002 to be insulated from the first electrode 103 of the effective working region 001, after patterning the piezoelectric stacked layer structure 120', the second electrode 105 may be etched to form the second opening 140b, such that in at least a portion of the corresponding region, the second electrode 105 of the parasitic working region 002 may be insulated from the second electrode 105 of the effective working region 001.

Patterning the piezoelectric stacked layer structure 120' may include etching the second electrode layer 105' and the piezoelectric material layer 104' to form the second trench 120b. The projections of the first trench 120a and the second trench 120b on the plane where the piezoelectric layer 104 is located may complementarily enclose a ring. A region inside the ring is the effective working region 001, and a region outside the ring is the parasitic working region 002.

Referring to FIG. 2K, the projection of the second trench 120b on the plane where the piezoelectric layer 104 is located may be a semi-circular or semi-circular-like polygon; and the projections of the first trench 120a and the second trench 120b on the plane where the piezoelectric layer 104 is located may be exactly connected or close to be connected. That is, the projections of the first trench 120a and the second trench 120b on the plane where the piezoelectric layer 104 is located may form a completely closed ring or an approximately closed ring. The shape (the effective working region 001) formed by the projections of the first trench 120a and the second trench 120b on the plane where the piezoelectric layer 104 is located may be an exactly connected pentagon which does not include any pair of relatively parallel sides.

Referring to FIG. 2L, the first opening 140a and the second opening 140b may be located on the upper and lower sides of the piezoelectric layer 104, respectively. For example, a dry etching process may be used to form the second opening 140b at the projection junction of the first trench 120a and the second trench 120b on the plane where the piezoelectric layer 104 is located, thereby dividing the second electrode 105, and the second opening 140b may extend till the second electrode 105 is divided. The second opening 140b may be formed at one or each of the projection junctions of the first trench 120a and the second trench 120b on the plane where the piezoelectric layer 104 is located. For example, the first opening 140a may be formed at one junction of the projections of the first trench 120a and the second trench 120b on the plane where the piezoelectric layer 104 is located; and the second opening 140b may be formed at another junction of the projection of the first trench 120a and the second trench 120b on the plane where the piezoelectric layer 104 is located, as shown in FIG. 2M. Moreover, on the basis of ensuring that the first electrical connection terminal and the second electrical connection terminal are effectively connected to the effective working area, the first opening 140a may be located on the side of the second trench 120b, and the second opening 140b may also be located on the side of the first trench 120a, as shown in FIG. 2N. Both or one of the first opening 140a and the second opening 140b may exist in the structure of the film bulk acoustic resonator. Obviously, the first opening 140a and the second opening 140b may also be in other positions of the parasitic working region 002, which may not be limited according to the embodiments of the present disclosure.

In the parasitic working region 002, the first electrode 103 and the second electrode 105 may have the corresponding region along the thickness direction. The first electrode 103 of the parasitic working region 002 may be a surface electrode surrounding the effective working region 001, and the first opening 140a may separate the first electrode 103, such that, in at least a portion of the corresponding region, the first electrode 103 of the parasitic working region 002 may be insulated from the first electrode 103 of the effective working region 001. The second electrode 105 of the parasitic working region 002 may be a surface electrode surrounding the effective working region 001, and the second opening 140b may insulate the second electrode 105 of the parasitic working region 002 from the second electrode 105 of the effective working area 001. The first opening 140a or the second opening 140b may divide the first electrode 103 or the second electrode 105 of the parasitic working region 002, thereby reducing the parasitic parameters of the parasitic working region 002.

Finally, referring to FIGS. 2O-2P, the second substrate 200 may be provided, the second support layer 106 may be formed on the second electrode 105, and the second cavity 110b may be formed in the second support layer 106 as the encapsulation cavity of the film bulk acoustic resonator; and the provided second substrate 200 may be disposed by covering the second support layer 106. The material of the second support layer 106, which is same as the material of the first support layer 101, may include one or a combination of silicon dioxide ($SiO_2$), silicon nitride ($Si_3N_4$), aluminum oxide ($Al_2O_3$), and aluminum nitride (AlN). In one embodiment, the material of the second support layer 106 may be silicon dioxide ($SiO_2$), and the thickness of the second support layer 106 may be between about 10 mm and about 30 mm. After the bonding process, the edge portion of the second electrode 105 may not be covered to expose the electrical connection terminal 105a of the second electrode, thereby facilitating the signal input and output of the second electrode 105. For example, the second soldering pad may be formed on the electrical connection terminal 105a of the second electrode. Moreover, during the process of etching the second electrode layer 105' and the piezoelectric material layer 104' to form the second trench 120b, a portion (edge portion) of the second electrode layer 105' and the piezoelectric material layer 104' may be etched to expose the electrical connection terminal 103a of the first electrode on the side of the first electrode layer 103', thereby facilitating the signal input and output of the first electrode 103. For example, the first soldering pad may be formed on the electrical connection terminal 103a of the first electrode.

Obviously, the second trench 120b, the second opening 140b and the second cavity 110b may also be formed by the following process. The second support layer 106 may be formed on the second electrode 105, and the second cavity 110b may be formed in the second support layers 106; then, the region of the second cavity 110b may be etched to pattern the piezoelectric stack structure 120' and form the second opening 140b; finally, the second substrate 200 may be provided, and the second substrate 200 may be bonded with the second support layer 106 to form the second cavity 110b on the second electrode 105.

Embodiment 4

The embodiment of the present disclosure provides a fabrication method of a film bulk acoustic resonator. The difference from the third embodiment is that, in one embodiment, passing through the second electrode 105, the piezoelectric layer 104, and the first electrode 103 by the first opening 140a and the second opening 140b may be performed simultaneously by a dry etching process after the piezoelectric stacked layer 120 is patterned. The fabrication method of the film bulk acoustic resonator provided in one embodiment may include:

- S11, providing the third substrate 300 and forming the piezoelectric stacked layer structure 120' on the third substrate 300, where the piezoelectric stacked layer structure 120' may include the second electrode layer 105', the piezoelectric material layer 104', and the first electrode layer 103' which are sequentially formed on the third substrate 300;
- S12, forming the first support layer 101 on the first electrode layer 103' and forming the first cavity 110a, which may pass through the first support layer 101, in the first support layer 101;
- S13, providing the first substrate 100 and bonding the first substrate 100 with the first support layer 101;
- S14, removing the third substrate 300;
- S15, patterning the piezoelectric stacked layer structure 120' to form the first electrode 103, the piezoelectric layer 104, the second electrode 105, and dividing the piezoelectric stacked layer structure into the effective working region 001 and the parasitic working region 002, where in the parasitic working region 002, the first electrode 103 and the second electrode 105 may have the corresponding region along the thickness direction; and
- S16, etching the second electrode 105, the piezoelectric layer 104, and the first electrode to form the opening, such that, in at least a portion of the corresponding region, the first electrode 103 of the parasitic working region 002 may be insulated from the first electrode 103 of the effective working region 001, and the second electrode 105 of the parasitic working region 002 may be insulated from the second electrode 105 of the effective working region 001.

Figure 3:
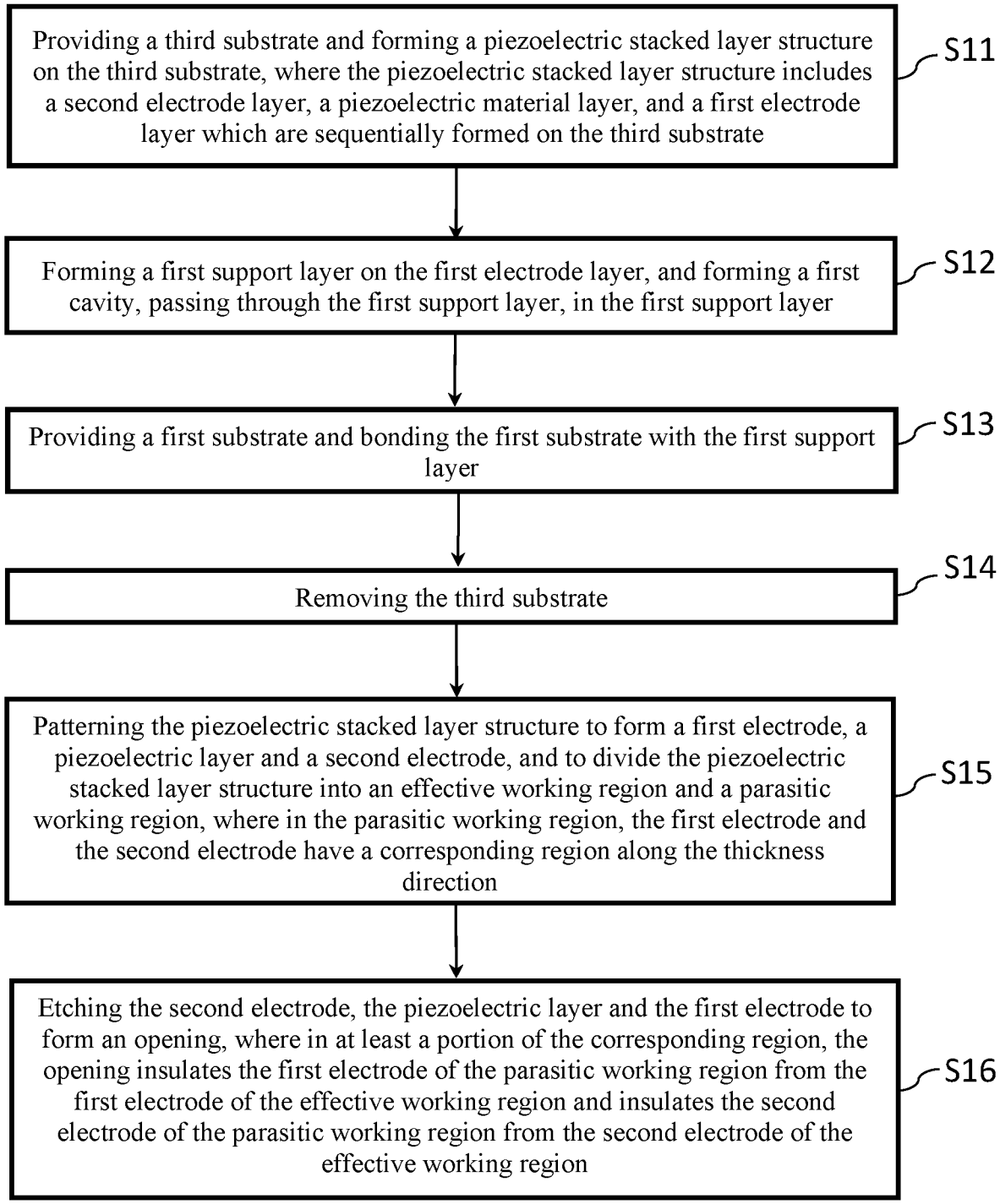
FIG. 3 illustrates another flowchart of a fabrication method of a film bulk acoustic resonator according to various embodiments of the present disclosure.

FIGS. 4A-4N illustrate structural schematics corresponding to certain stages of the fabrication method of the film bulk acoustic resonator according to various embodiments of the present disclosure. The fabrication method of the film bulk acoustic resonator provided in one embodiment is described in detail with reference to FIG. 3 and FIGS. 4A-4N hereinafter.

Referring to FIG. 4A, step S1*l* may be performed to provide the third substrate 300 and form the piezoelectric stacked layer structure 120' on the third substrate 300. The piezoelectric stacked layer structure 120' may include the second electrode layer 105', the piezoelectric material layer 104', and the first electrode layer 103' which are sequentially formed on the third substrate 300. A release layer (not shown in FIG. 6) may also be formed between the third substrate 300 and the piezoelectric stacked layer structure 120' (the second electrode 105). The release layer may be used as a protective layer of the third substrate 300 to avoid the influence of the piezoelectric stacked layer structure 120' of the film bulk acoustic resonator formed subsequently on the third substrate 300; meanwhile, in the subsequent peeling process, the third substrate 300 may be separated from the piezoelectric stacked layer structure 120' formed subsequently by the manner of removing the release layer, which is beneficial for rapidly peeling off the third substrate 300 and improving the manufacturing efficiency.

The shapes of the second electrode layer 105', the piezoelectric material layer 104', and the first electrode layer 103' may be same or different, and the areas of the second electrode layer 105', the piezoelectric material layer 104', and the first electrode layer 103' may be same or different. In one embodiment, the shapes and areas of the second electrode layer 105', the piezoelectric material layer 104', and the first electrode layer 103' may be same, where the shapes may all be polygonal, such as square.

Referring to FIGS. 4B-4C, step S12 may be performed to form the first support layer 101 on the first electrode layer 103' and form the first cavity 110a in the first support layer 101 to expose a portion of the first electrode layer 103', and to etch the first electrode layer 103' and the piezoelectric material layer 104' to form the first trench 120a, where the first trench 120a may be connected to the first cavity 110a. The shape of the bottom surface of the first cavity 110a may be a rectangle or a polygon other than a rectangle, such as a pentagon, a hexagon, an octagon, and the like, and may also be a circle or an ellipse. In one embodiment of the present disclosure, the longitudinal cross-sectional shape of the first cavity 110a may also be a spherical crown with a wide top and a narrow bottom, that is, the longitudinal cross-section may be U-shaped. The sidewalls of the first trench 120a may be inclined or vertical. In one embodiment, the sidewall of the first trench 120a may form an obtuse angle with the plane where the second electrode layer 105' is located (the longitudinal cross-section (cross-section along the thickness direction) of the first trench 120a is an inverted trapezoid). The projection of the first trench 120a on the plane of the piezoelectric layer 104 may be a half-ring or half-ring-like polygon.

Referring to FIG. 4D, step S13 may be performed to bond the first substrate 100 with the first support layer 101. The bonding of the first substrate 100 and the first support layer 101 may be implemented by a thermocompression bonding process. After the bonding process is completed, the above-mentioned film bulk acoustic resonator after the bonding process may be turned over for subsequent steps.

Referring to FIG. 4E, step S14 may be performed to remove the third substrate 300. In one embodiment, the third substrate 300 may be removed through a thinning process, a heat release process, and a peeling process, which may refer to the removing process in the third embodiment.

Referring to FIGS. 4F-4H, step S15 may be performed to pattern the piezoelectric stacked layer structure 120' to form the first electrode 103, the piezoelectric layer 104, the second electrode 105, and divide the piezoelectric stacked layer structure 120' into the effective working region 001 and the parasitic working region 002, where in the parasitic working region 002, the first electrode 103 and the second electrode 105 may have a corresponding region along the thickness direction.

The second electrode 105, the piezoelectric layer 104, and the first electrode 103 may be etched to form the second openings, such that in at least a portion of the corresponding region, the second electrode 105 of the parasitic working region 002 may be insulated from the second electrode 105 of the effective working region 001, and the first electrode 103 of the parasitic working region 002 may be insulated from the first electrode 103 of the effective working region 001.

Patterning the piezoelectric stacked layer structure 120' may include etching the second electrode layer 105' and the piezoelectric material layer 104' to form the second trench 120b. The projections of the first trench 120a and the second trench 120b on the plane where the piezoelectric layer 104 is located may complementarily enclose a ring. A region inside the ring is the effective working region 001, and a region outside the ring is the parasitic working region 002.

The fabrication method of the film bulk acoustic resonator provided by the present disclosure may further include, during the process of etching the second electrode 105 and the piezoelectric layer 104 to form the second trench 120b, a portion (edge portion) of the second electrode 105 and the piezoelectric layer 104 may be etched to expose the electrical connection terminal 103a of the first electrode on one side of the first electrode 103, thereby facilitating the signal input and output of the first electrode 103. For example, the first soldering pad may be formed on the electrical connection terminal 103a of the first electrode.

FIG. 4F-4G illustrate top views after the first trench 120a and the second trench 120b are formed according to the embodiment of the present disclosure; and FIG. 4H illustrates a cross-sectional structural schematic (along the EE' axis in FIG. 4I) after the first trench 120a and the second trench 120b are formed according to the embodiment of the present disclosure. Referring to FIGS. 4F-4G, the projections of the first trench 120a and the second trench 120b on the plane where the piezoelectric layer 104 is located may be semi-circular or semi-circular-like shapes; and the projections of the first trench 120a and the second trench 120b on the plane where the piezoelectric layer 104 is located may be exactly connected or close to be connected. The junctions of the projections of the first trench 120a and the second trench 120b on the plane where the piezoelectric layer 104 is located may include the first junction 150a and the second junction 105b. The ring region, formed by the projections of the first trench 120a and the second trench 120b on the plane where the piezoelectric layer 104 is located, may be the effective working region 001 of the film bulk acoustic resonator. In one embodiment, the ring (the effective working region 001) formed by the projections of the first trench 120a and the second trench 120b on the plane where the piezoelectric layer 104 is located may be an exactly connected pentagonal ring; and the polygon may not include any pair of relatively parallel sides. In other embodiments of the present disclosure, the ring formed by the projections of the first trench 120a and the second trench 120b on the plane where the piezoelectric layer 104 is located may also be a nearly closed pentagonal ring with openings (the first junction opening 150a' and the second junction opening 150b') at two junctions, as shown in FIG. 4G.

Referring to FIGS. 4I-4K, step S16 may be performed to etch the second electrode 105, the piezoelectric layer 104, and the first electrode 105 to form the openings, such that, in at least a portion of the corresponding region, the first electrode 103 of the parasitic working region 002 may be insulated from the first electrode 103 of the effective working region 001, and the second electrode 105 of the parasitic working region 002 may be insulated from the second electrode 105 of the effective working region 001.

The openings may include the first opening 140a' and the second opening 140b' formed at the first junction 150a and the second junction 150b. When the ring formed by the projections of the first trench 120a and the second trench 120b on the plane where the piezoelectric layer 104 is located has openings (the first junction opening 150a' and the second junction opening 150b') at two junctions, the projection of the first opening 140a' on the plane where the piezoelectric layer 104 is located may cover the first junction opening 150a', and the projection of the second opening 140b' on the plane where the piezoelectric layer 104 is located may cover the second junction opening 150b'.

Finally, referring to FIGS. 4L-4N, the second substrate 200 may be provided, the second support layer 106 may be formed on the second substrate 200, the second support layer 106 may be etched to expose a portion of the second substrate 200, and the second cavity 110b may be formed in the second support layer 106. The second support layer 106 may be bonded with the second electrode 105; and the edge portion of the second electrode 105 may not be covered after the bonding process to expose the electrical connection terminal 105a of the second electrode, thereby facilitating the signal input and output of the second electrode 105. For example, the second soldering pad may be formed on the electrical connection terminal 105a of the second electrode.

From the above-mentioned embodiments, it can be seen that the technical solutions provided by the present disclosure may achieve at least the following beneficial effects.

The film bulk acoustic resonator and its fabrication method are provided in the present disclosure. The film bulk acoustic resonator provided by the present disclosure may include the first substrate and the first support layer disposed on the first substrate, where the first support layer contains the first cavity. The film bulk acoustic resonator further include the piezoelectric stacked layer covering the top opening of the first cavity, where the piezoelectric stacked layer includes the first electrode, the piezoelectric layer, and the second electrode which are sequentially disposed on the first support layer, and the piezoelectric stacked layer includes the effective working region and the parasitic working region, where in the parasitic working region, the first electrode and the second electrode have the corresponding region along the thickness direction. The film bulk acoustic resonator further include the first separation structure and/or the second separation structure, where the first separation structure separates the first electrode, and in at least a portion of the corresponding region, the first electrode of a portion of the parasitic working region is insulated from the first electrode of the effective working region; and the second separation structure separates the second electrode, and in at least a portion of the corresponding region, the second electrode of a portion of the parasitic working region is insulated from the second electrode of the effective working region. In one embodiment, the first separation structure and the second separation structure may insulate, in at least a portion of the corresponding region, the first electrode and the second electrode of the parasitic working region from the first electrode and the second electrode of the effective working region, which may effectively reduce the parasitic resonance, improve the acoustic wave loss, thereby improving the quality factor of the film bulk acoustic resonator and further improving the device performance. Meanwhile, the first cavity and the second cavity, located on the upper and lower sides of the piezoelectric stacked layer, may be connected to each other through the arrangement of the first separation structure and the second separation structure, which may release the pressure of the first cavity under the piezoelectric stacked layer structure, avoid bending of the effective working region of the film bulk acoustic resonator due to pressure, maintain the effective working region to be relatively flat, thereby further improving the quality factor of the film bulk acoustic resonator.

It should be noted that each embodiment in present specification may be described in a related manner, and the same or similar parts between the various embodiments may be referred to each other. Each embodiment may focus on the differences from other embodiments. Particularly, as for the structural embodiments, since it is basically similar to the method embodiments, the description may be relatively simple, and related parts may refer to the partial description of the method embodiments.

The above-mentioned description may merely the description of preferred embodiments of the present disclosure and may not limit the scope of the present disclosure in any way. Any changes or modifications made by those skilled in the art in the field of the present disclosure according to the above-mentioned description shall fall within the protection scope of the claims.

What is claimed is:

1. A film bulk acoustic resonator, comprising: a first substrate and a first support layer disposed on the first substrate, wherein the first support layer contains a first cavity; a piezoelectric stacked layer covering a top opening of the first cavity, wherein the piezoelectric stacked layer includes a first electrode, a piezoelectric layer and a second electrode which are sequentially disposed on the first support layer; and the piezoelectric stacked layer includes an effective working region and a parasitic working region, wherein in the parasitic working region, the first electrode and the second electrode have a corresponding region along a thickness direction; and a first separation structure and a second separation structure, wherein: the first separation structure separate the first electrode, and in at least a portion of the corresponding region, the first electrode of a portion of the parasitic working region in insulated from the first electrode of the effective working region; and the second separation structure separates the second electrode, and in at least a portion of the corresponding region, the second of a portion of the parasitic working region in insulated from the second electrode of the effective working region.

2. The film bulk acoustic resonator according to claim 1, wherein:
the first separation structure includes a first opening which is formed in the first electrode and divides the first electrode into a plurality of first electrode portions separated from each other; or
the first separation structure includes a first opening formed in the first electrode and an insulation material filled in the first opening.

3. The film bulk acoustic resonator according to claim 2, wherein:
the second separation structure includes a second opening which is formed in the second electrode and divides the second electrode into a plurality of second electrode portions separated from each other; or
the second separation structure includes a second opening formed in the second electrode and an insulation material filled in the second opening.

4. The film bulk acoustic resonator according to claim 3, wherein:
the first electrode has a first dividing structure, and the second electrode has a second dividing structure; the first dividing structure and the second dividing structure complementarily enclose a ring to define the effective working region and the parasitic working region; and a region inside the ring is the effective working region, and a region outside the ring is the parasitic working region.

5. The film bulk acoustic resonator according to claim 4, wherein:
an electrical connection terminal of the first electrode is at a side of the second dividing structure; and an electrical connection terminal of the second electrode is at a side of the first dividing structure.

6. The film bulk acoustic resonator according to claim 5, wherein:
the first separation structure is at the side of the first dividing structure or at a junction of the first dividing structure and the second dividing structure; and/or
the second separation structure is at the side of the second dividing structure or at the junction of the first dividing structure and the second dividing structure.

7. The film bulk acoustic resonator according to claim 4, wherein:
the first dividing structure includes a first trench passing through the first electrode and the piezoelectric layer along the thickness direction; and/or
the second dividing structure includes a second trench passing through the second electrode and the piezoelectric layer along the thickness direction.

8. The film bulk acoustic resonator according to claim 4, wherein:
above the first cavity, the first electrode of the parasitic working region is a surface electrode surrounding the effective working region; and
the first opening divides the first electrode at a junction of the first dividing structure and the second dividing structure and extends till the first electrode is divided.

9. The film bulk acoustic resonator according to claim 8, wherein:
above the first cavity, the second electrode of the parasitic working region is a surface electrode surrounding the effective working region; and
the second opening divides the second electrode at the junction of the first dividing structure and the second dividing structure and extends till the second electrode is divided.

10. The film bulk acoustic resonator according to claim 9, wherein:
the first opening and the second opening, passing through each other along a vertical direction, pass through the piezoelectric layer.

11. The film bulk acoustic resonator according to claim 9, wherein:
a shape of the effective working region is a polygonal ring, and any two sides of the polygonal ring are not in parallel with each other.

12. The film bulk acoustic resonator according to claim 4, further including:
a second support layer disposed on the second electrode, wherein the second support layer contains a second cavity used as an encapsulation cavity; and
a second substrate disposed on the second support layer.

* * * * *